United States Patent
Hong et al.

(10) Patent No.: US 10,861,860 B2
(45) Date of Patent: Dec. 8, 2020

(54) METHOD OF MANUFACTURING A SEMICONDUCTOR DEVICE

(71) Applicant: SAMSUNG ELECTRONICS CO., LTD., Suwon-si (KR)

(72) Inventors: Seungsoo Hong, Incheon (KR); JeongYun Lee, Yongin-si (KR); GeumJung Seong, Seoul (KR); HyunHo Jung, Seoul (KR); Minchan Gwak, Hwaseong-si (KR); Kyungseok Min, Yongin-si (KR); Youngmook Oh, Hwaseong-si (KR); Jae-Hoon Woo, Hwaseong-si (KR); Bora Lim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/386,407

(22) Filed: Apr. 17, 2019

(65) Prior Publication Data

US 2019/0244965 A1    Aug. 8, 2019

Related U.S. Application Data

(63) Continuation of application No. 15/635,583, filed on Jun. 28, 2017, now Pat. No. 10,332,898.

(30) Foreign Application Priority Data

Nov. 22, 2016  (KR) .......................... 10-2016-0155967

(51) Int. Cl.
*H01L 27/11* (2006.01)
*H01L 27/092* (2006.01)
*H01L 21/8238* (2006.01)
*H01L 29/06* (2006.01)
*H01L 29/78* (2006.01)

(52) U.S. Cl.
CPC .. *H01L 27/1108* (2013.01); *H01L 21/823821* (2013.01); *H01L 27/0924* (2013.01); *H01L 27/1104* (2013.01); *H01L 27/1116* (2013.01); *H01L 29/0649* (2013.01); *H01L 29/785* (2013.01)

(58) Field of Classification Search
CPC ............. H01L 27/1108; H01L 27/1104; H01L 27/1116; H01L 27/11521; H01L 27/11534; H01L 27/11568
See application file for complete search history.

(56) References Cited

U.S. PATENT DOCUMENTS 8,492,206 B2   7/2013  Zhong et al.
9,214,358 B1  12/2015  Lin et al.
(Continued)

*Primary Examiner* — Walter H Swanson
(74) *Attorney, Agent, or Firm* — Lee IP Law, P.C.

(57) ABSTRACT

A semiconductor device includes a first active pattern and a second active pattern on a substrate, a first gate electrode and a second gate electrode respectively across the first active pattern and the second active pattern, a first insulation pattern between and separating the first and second gate electrodes, a gate spacer on a sidewall of the first gate electrode, on a sidewall of the second gate electrode, and on a sidewall of the first insulation pattern, and a second insulation pattern between the gate spacer and the sidewall of the first insulation pattern, wherein the first gate electrode, the first insulation pattern, and the second gate electrode are arranged along a first direction, and wherein the gate spacer extends in the first direction.

20 Claims, 61 Drawing Sheets

(56) References Cited

U.S. PATENT DOCUMENTS

| | | |
|---|---|---|
| 9,331,074 B1 | 5/2016 | Chang et al. |
| 9,373,641 B2 | 6/2016 | Anderson et al. |
| 2016/0020150 A1 | 1/2016 | You et al. |
| 2016/0027700 A1 | 1/2016 | Cai et al. |
| 2016/0086947 A1 | 3/2016 | Park et al. |
| 2016/0111369 A1 | 4/2016 | Or-Bach et al. |
| 2016/0141392 A1 | 5/2016 | Kim et al. |
| 2016/0211250 A1 | 7/2016 | Langheinrich et al. |

METHOD OF MANUFACTURING A SEMICONDUCTOR DEVICE

CROSS-REFERENCE TO RELATED APPLICATIONS

This is a continuation application based on pending application Ser. No. 15/635,583, filed Jun. 28, 2017, the entire contents of which is hereby incorporated by reference.

Korean Patent Application No. 10-2016-0155967, filed on Nov. 22, 2016, in the Korean Intellectual Property Office, and entitled: "Semiconductor Device and Method of Manufacturing the Same," is incorporated by reference herein in its entirety.

BACKGROUND

1. Field

The present disclosure relates to a semiconductor device and a method of manufacturing the same, and more particularly, to a semiconductor device and a method of manufacturing the same including a field effect transistor.

2. Description of the Related Art

Semiconductor devices are considered to be an important factor in electronic industry because of their small size, multi-function, and/or low fabrication cost. The semiconductor devices may be categorized as any one of semiconductor memory devices storing logic data, semiconductor logic devices processing operations of logic data, and hybrid semiconductor devices having both memory and logic elements. The semiconductor devices have been increasingly required for high integration with the advanced development of the electronic industry. For example, the semiconductor devices have been increasingly requested for high reliability, highspeed, and/or multifunction. The semiconductor devices are gradually complicated and highly integrated to meet these requested characteristics.

SUMMARY

According to exemplary embodiments, a semiconductor device may include a first active pattern and a second active pattern on a substrate, a first gate electrode and a second gate electrode respectively running across the first active pattern and the second active pattern, a first insulation pattern interposed between and separating the first and second gate electrodes, a gate spacer on a sidewall of the first gate electrode, a sidewall of the second gate electrode, and a sidewall of the first insulation pattern, and a second insulation pattern interposed between the gate spacer and the sidewall of the first insulation pattern. The first gate electrode, the first insulation pattern, and the second gate electrode may be arranged along a first direction. The gate spacer may extend in the first direction.

According to exemplary embodiments, a semiconductor device may include a PMOSFET region and an NMOSFET region on a substrate, a first gate electrode running across the PMOSFET region, a second gate electrode running across the NMOSFET region, and a first insulation pattern and a second insulation pattern that are interposed between the first gate electrode and the second gate electrode. The first insulation pattern may include a first sidewall and a second sidewall opposite to each other. The first insulation pattern may further include a third sidewall and a fourth sidewall opposite to each other. The first and second gate electrodes may respectively face the first and second sidewalls. The second insulation pattern may cover the third and fourth sidewalls.

According to exemplary embodiments, a method of manufacturing a semiconductor device may include forming on a substrate a first active pattern and a second active pattern, forming a sacrificial pattern running across the first and second active patterns, forming a gate spacer on a sidewall of the sacrificial pattern, removing a first portion of the sacrificial pattern to form an opening, sequentially forming a lower insulation layer and an upper insulation layer that fill the opening, removing second and third portions of the sacrificial pattern to form a first empty space and a second empty space, and removing a portion of the lower insulation layer exposed through the first and second empty spaces to form a first insulation pattern. The first portion of the sacrificial pattern may be positioned between the first and second active patterns. The second portion of the sacrificial pattern may run across the first active pattern. The third portion of the sacrificial pattern may run across the second active pattern.

According to exemplary embodiments, a semiconductor device may include a first active pattern and a second active pattern on a substrate, a first gate electrode and a second gate electrode respectively across the first active pattern and the second active pattern, a first insulation pattern between the first and second gate electrodes, the first gate electrode, the first insulation pattern, and the second gate electrode being arranged along a first direction, and a second insulation pattern on sidewalls of the first insulation pattern, the second insulation pattern extending along the first direction.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
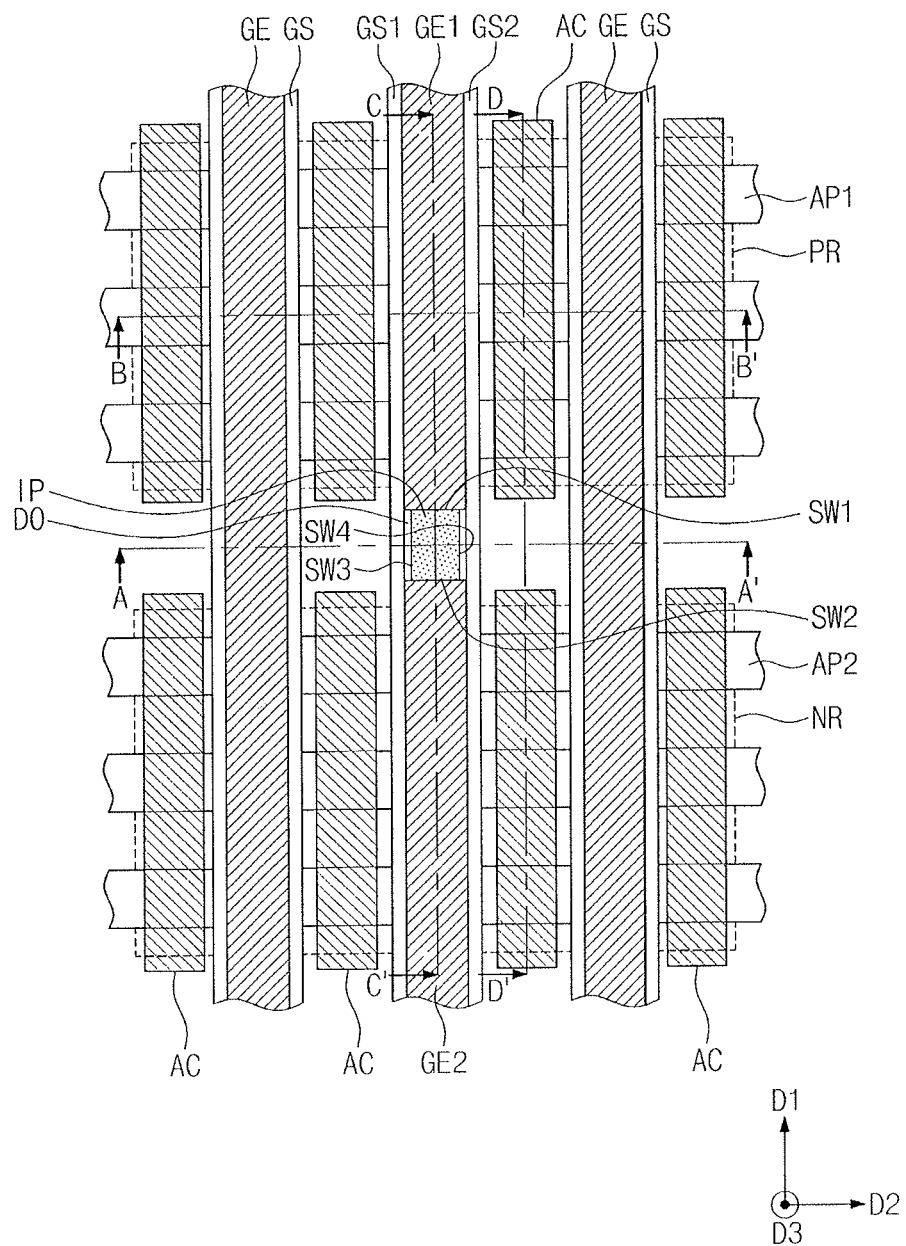
FIG. 1 illustrates a plan view of a semiconductor device according to exemplary embodiments.
Figure 2A:
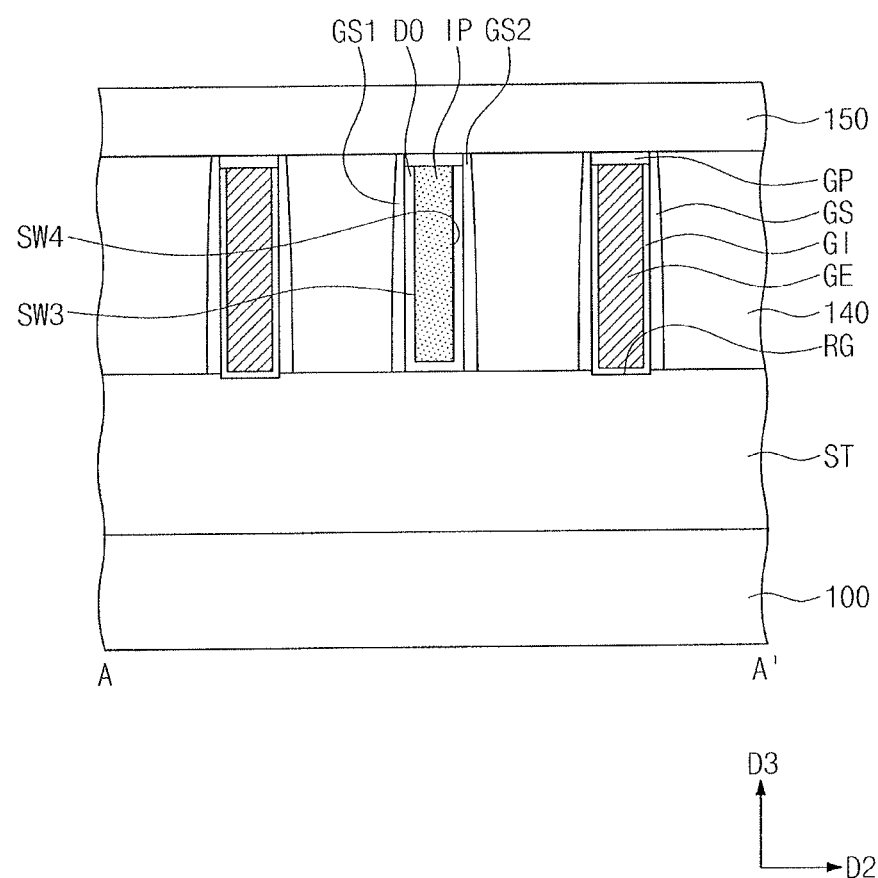
FIGS. 2A to 2D illustrate cross-sectional views taken along lines A-A', B-B', C-C', and D-D' of FIG. 1, respectively.
Figure 2B:
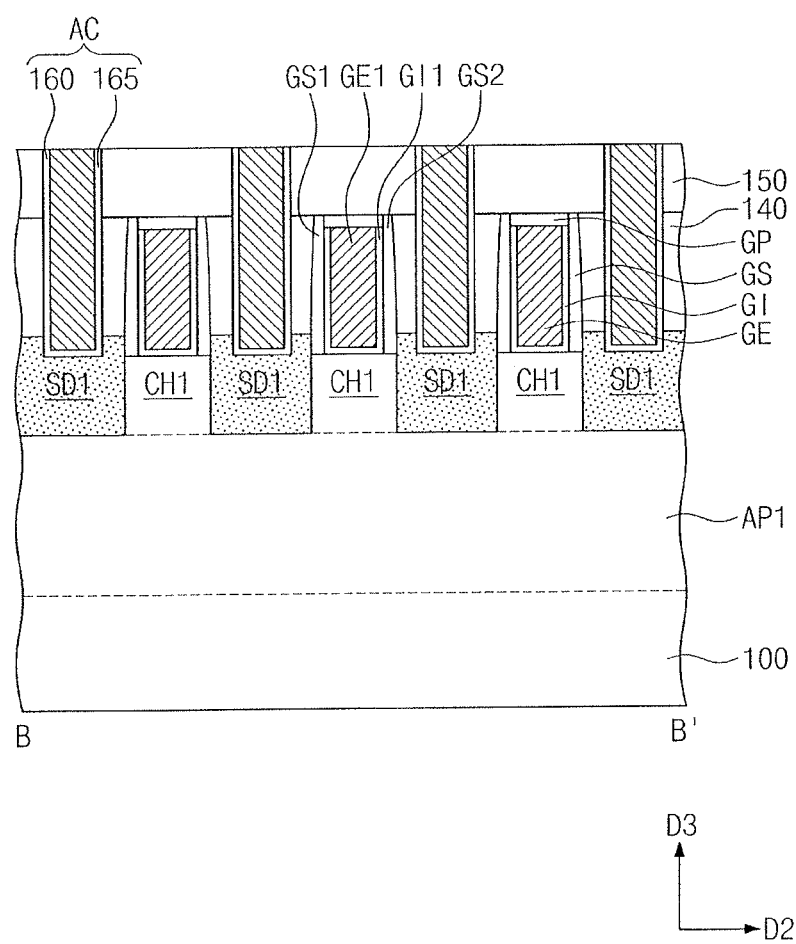

FIG. 1 is a plan view illustrating a semiconductor device according to exemplary embodiments. FIGS. 2A to 2D are cross-sectional views along lines A-A', B-B', C-C', and D-D' of FIG. 1, respectively. FIG. 3 is a perspective view illustrating first and second gate electrodes and first and second insulation patterns according to exemplary embodiments.

Referring to FIGS. 1, 2A to 2D, and 3, device isolation layers ST may be provided at an upper portion of a substrate 100. The device isolation layers ST may define a p-type metal oxide semiconductor field effect transistor (PMOSFET) region PR and an n-type metal oxide semiconductor field effect transistor (NMOSFET) region NR. The substrate 100 may be a compound semiconductor substrate or a semiconductor substrate including, e.g., silicon, germanium, silicon-germanium, and so forth. The device isolation layers ST may include an insulating material, e.g., a silicon oxide layer.

The PMOSFET region PR and the NMOSFET region NR may be spaced apart from each other across the device isolation layer ST in a first direction D1 parallel to a top surface of the substrate 100. The PMOSFET region PR and the NMOSFET region NR may extend in a second direction D2 crossing the first direction D1. The device isolation layer ST between the PMOSFET and NMOSFET regions PR and NR may be deeper than the device isolation layers ST between active patterns AP1 and AP2.

The PMOSFET and NMOSFET regions PR and NR may constitute a memory cell section for storing data. For example, the memory cell section of the substrate 100 may be provided thereon with memory cell transistors constituting a plurality of static random access memory (SRAM) cells. The PMOSFET and NMOSFET regions PR and NR may include at least one of the memory cell transistors.

Alternatively, the PMOSFET and NMOSFET regions PR and NR may be a logic cell section including thereon logic transistors constituting a logic circuit of a semiconductor device. For example, the logic cell section of the substrate 100 may be provided thereon with logic transistors constituting a processor core or an I/O terminal. The PMOSFET and NMOSFET regions PR and NR may include at least one of the logic transistors. The present embodiments, however, are not limited thereto.

The PMOSFET and NMOSFET regions PR and NR may be provided thereon with a plurality of the active patterns AP1 and AP2 extending in the second direction D2. The active patterns AP1 and AP2 may include first active patterns AP1 on the PMOSFET region PR and second active patterns AP2 on the NMOSFET region NR. The first and second active patterns AP1 and AP2 may be portions of the substrate 100 that protrude from the top surface of the substrate 100. The first and second active patterns AP1 and AP2 may be arranged along the first direction D1, e.g., the first and second active patterns AP1 and AP2 may extend along the second direction D2 and may be spaced apart from each other along the first direction D1.

A first trench TR1 may be defined between neighboring first active patterns AP1, and a second trench TR2 may be defined between neighboring second active patterns AP2. The device isolation layers ST may fill the first and second trenches TR1 and TR2. The device isolation layers ST may define the first and second active patterns AP1 and AP2. The device isolation layers ST may directly cover lower sidewalls of the first and second active patterns AP1 and AP2. For example, three first active patterns AP1 are illustrated on the PMOSFET region PR and three second active patterns AP2 are illustrated on the NMOSFET region NR in FIG. 1, but embodiments are not limited thereto.

Figure 2C:
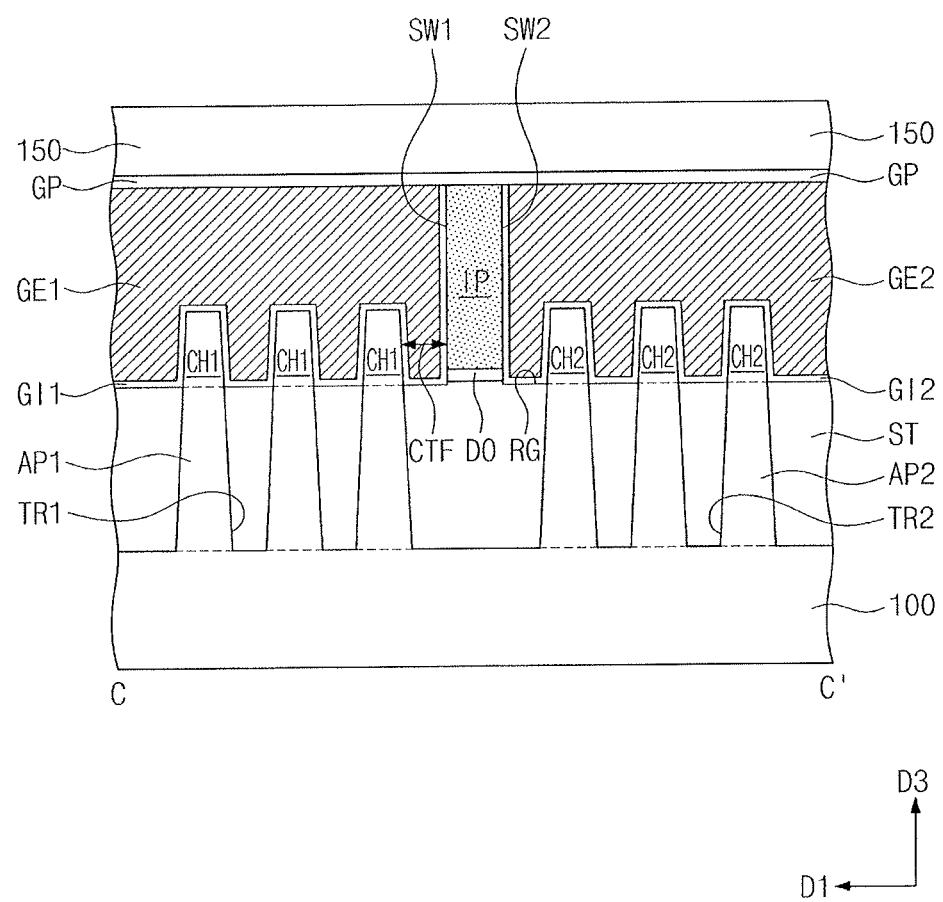
Figure 3:
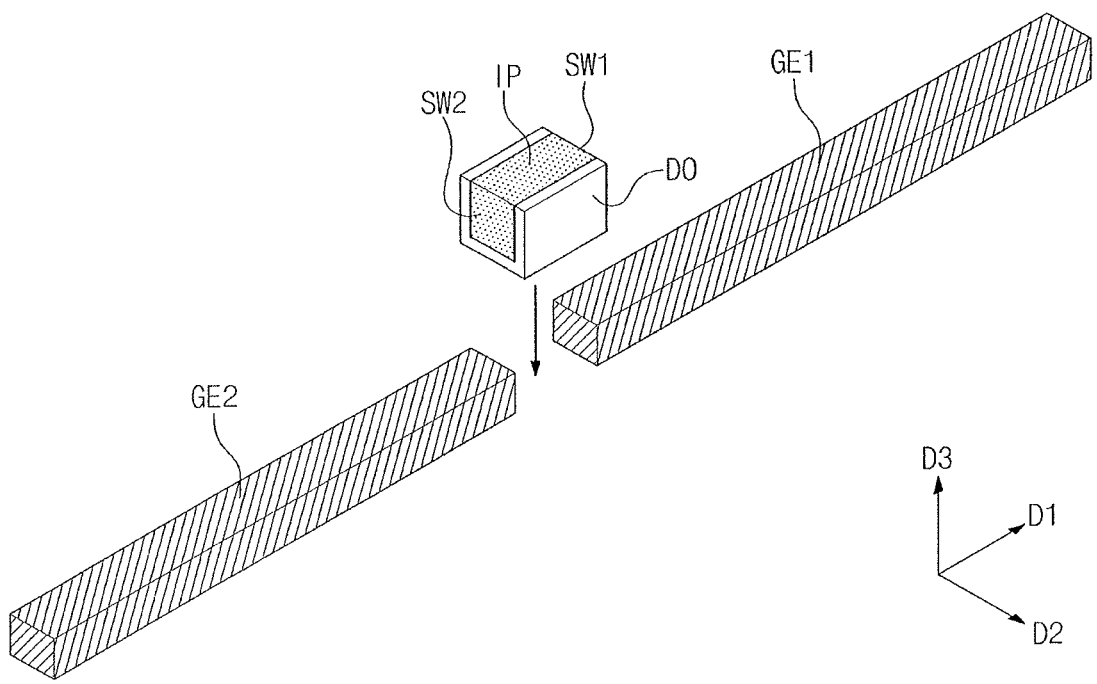
FIG. 3 illustrates a schematic perspective view of first and second gate electrodes and first and second insulation patterns according to exemplary embodiments.
Figure 4:
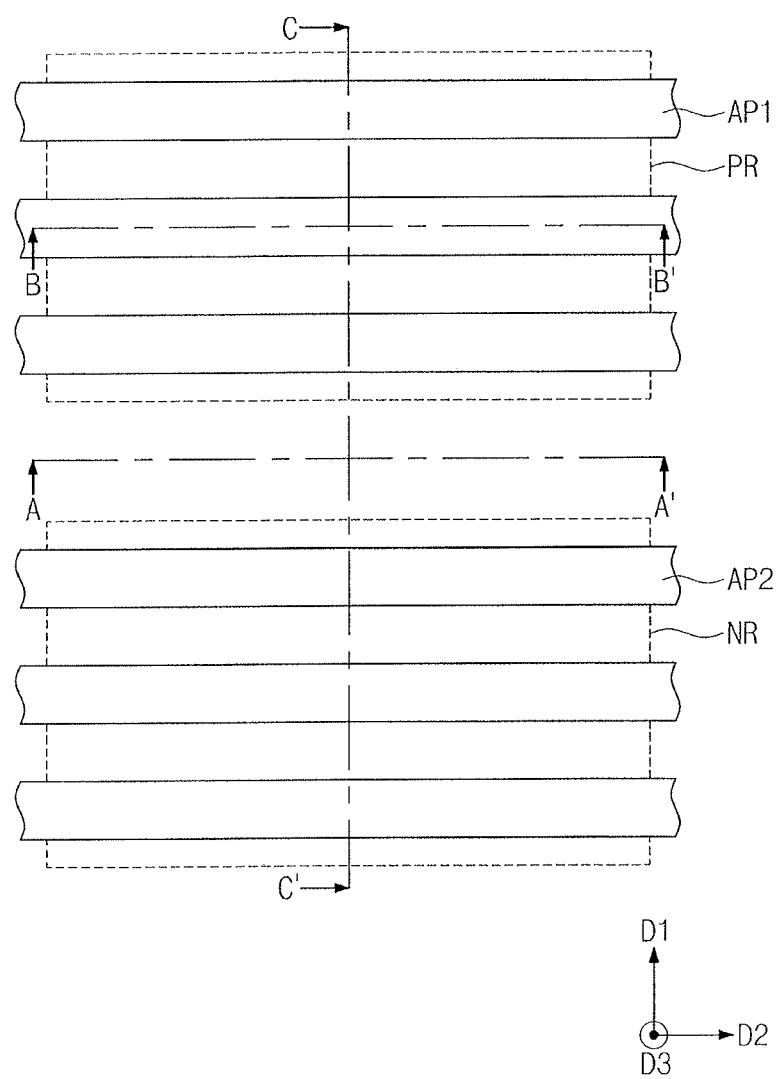
FIGS. 4, 6, 8, 10, 12, 14, 16, 18, and 20 illustrate plan views of stages in a method of manufacturing a semiconductor device according to exemplary embodiments.
Figure 5A:
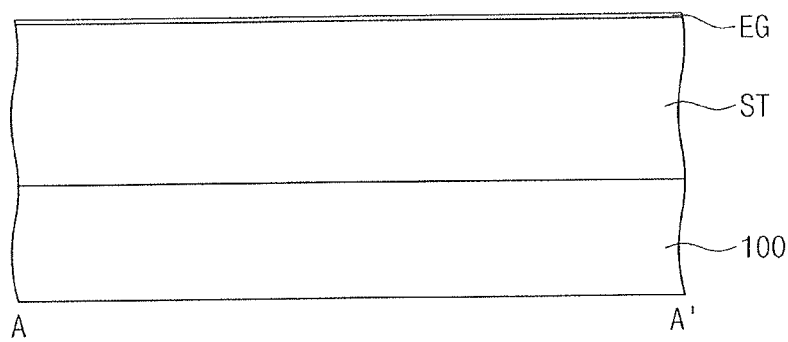
FIGS. 5A, 7A, 9A, 11A, 13A, 15A, 17A, 19A, and 21A illustrate cross-sectional views taken along line A-A' of FIGS. 4, 6, 8, 10, 12, 14, 16, 18, and 20, respectively.
Figure 5B:
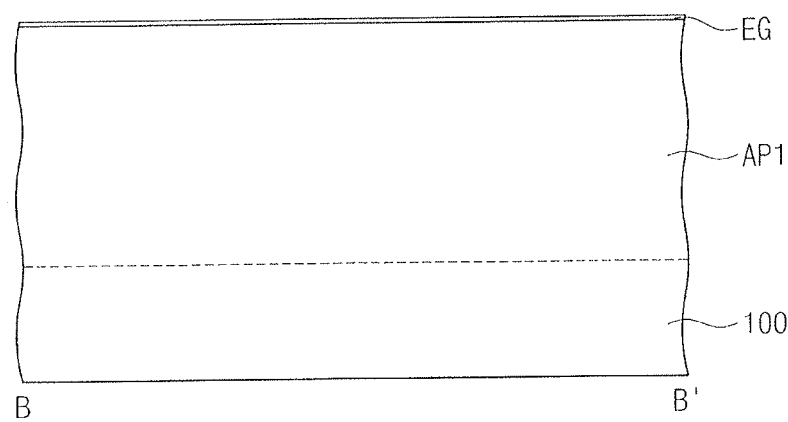
FIGS. 5B, 7B, 9B, 11B, 13B, 15B, 17B, 19B, and 21B illustrate cross-sectional views taken along line B-B' of FIGS. 4, 6, 8, 10, 12, 14, 16, 18, and 20, respectively.
Figure 5C:
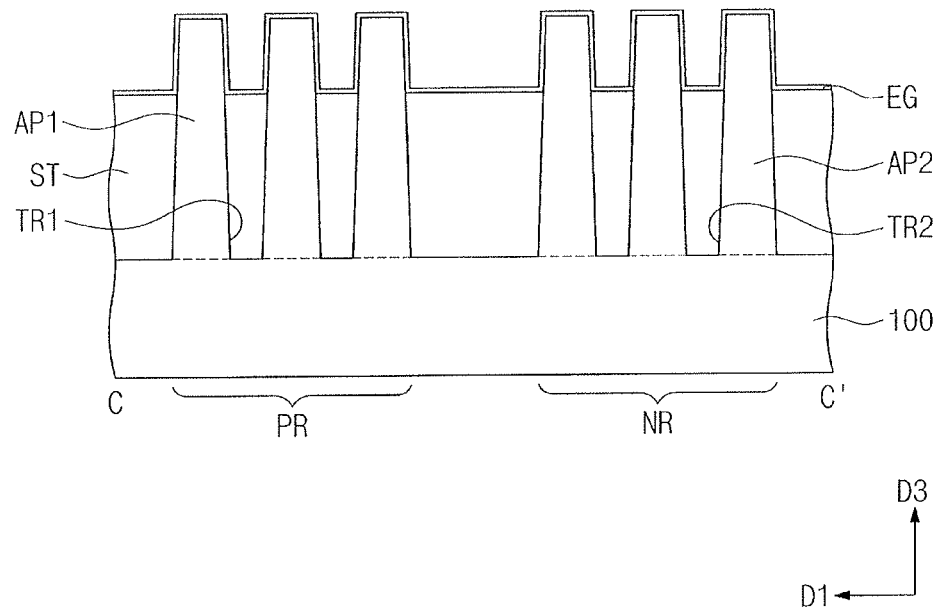
FIGS. 5C, 7C, 9C, 11C, 13C, 15C, 17C, 19C, and 21C illustrate cross-sectional views taken along line C-C' of FIGS. 4, 6, 8, 10, 12, 14, 16, 18, and 20, respectively.
Figure 6:
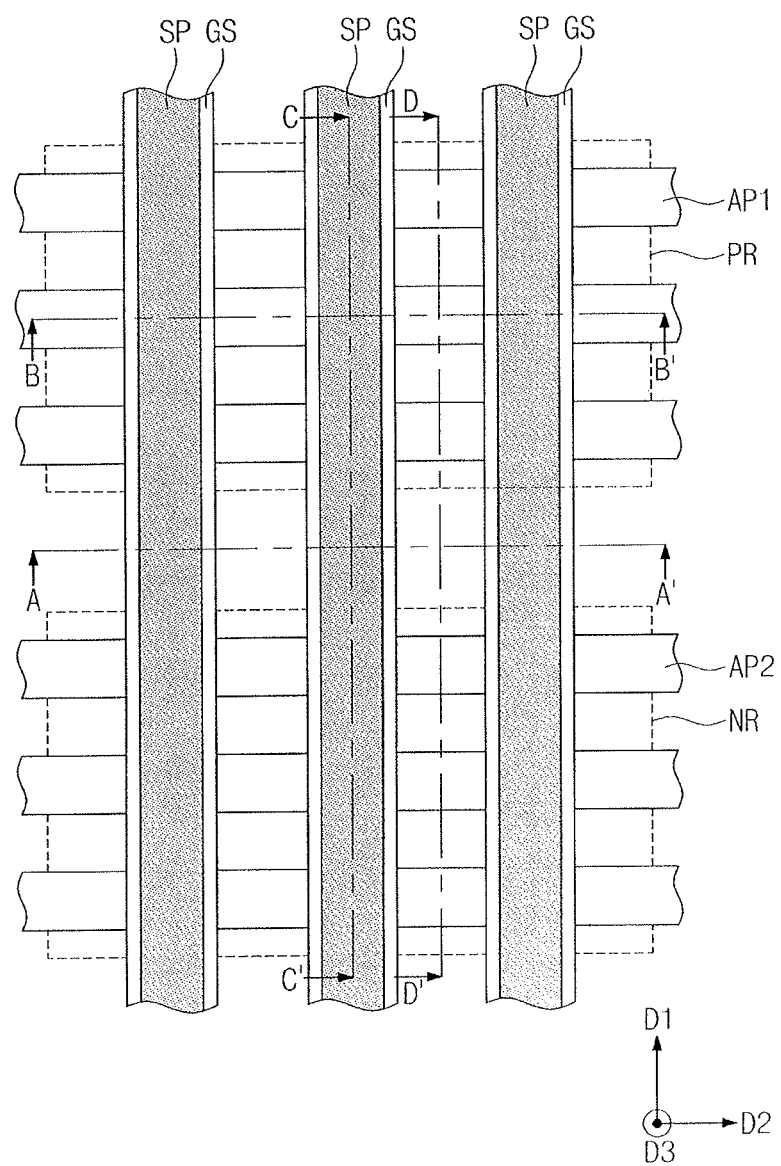
Figure 7A:
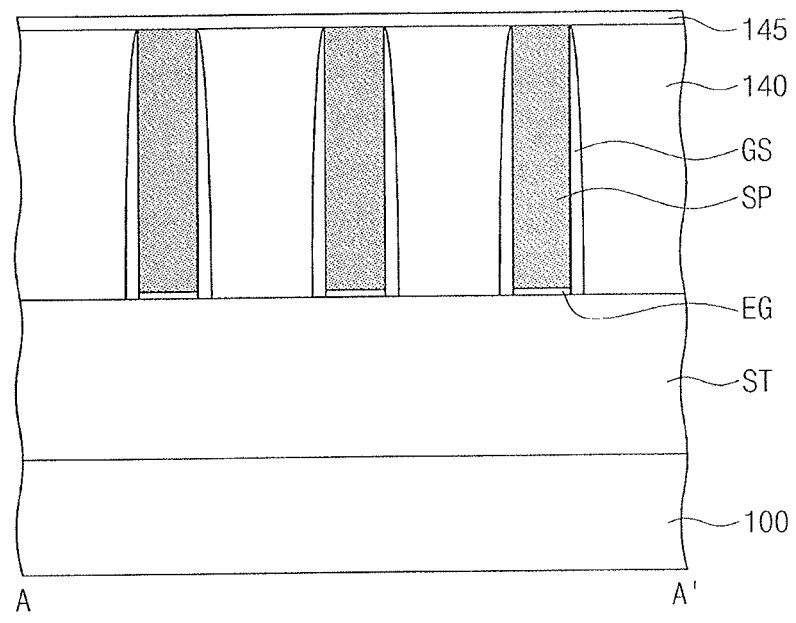
Figure 7B:
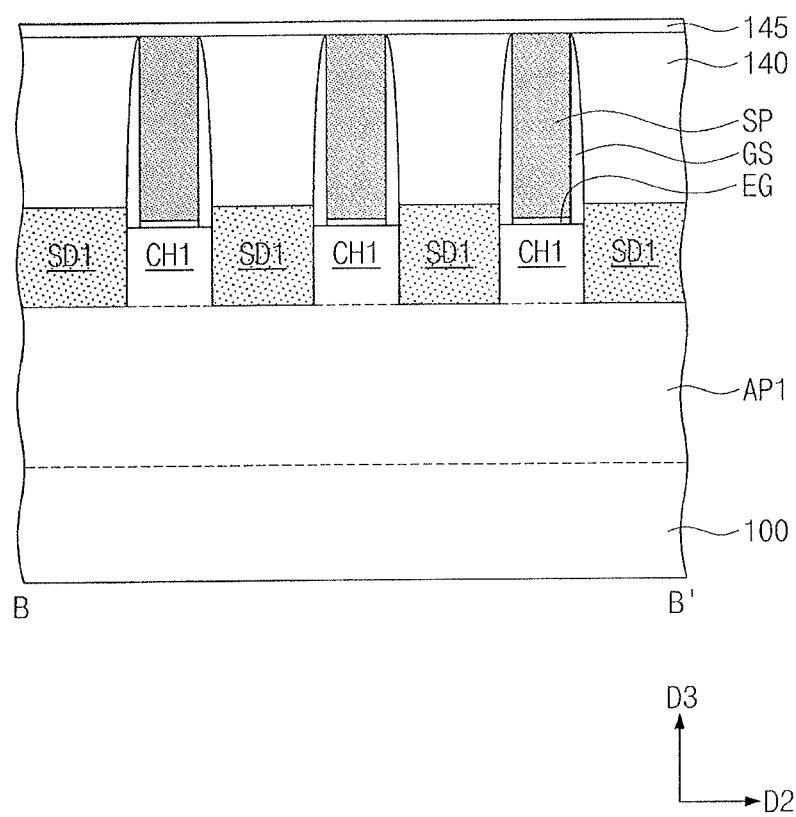
Figure 7C:
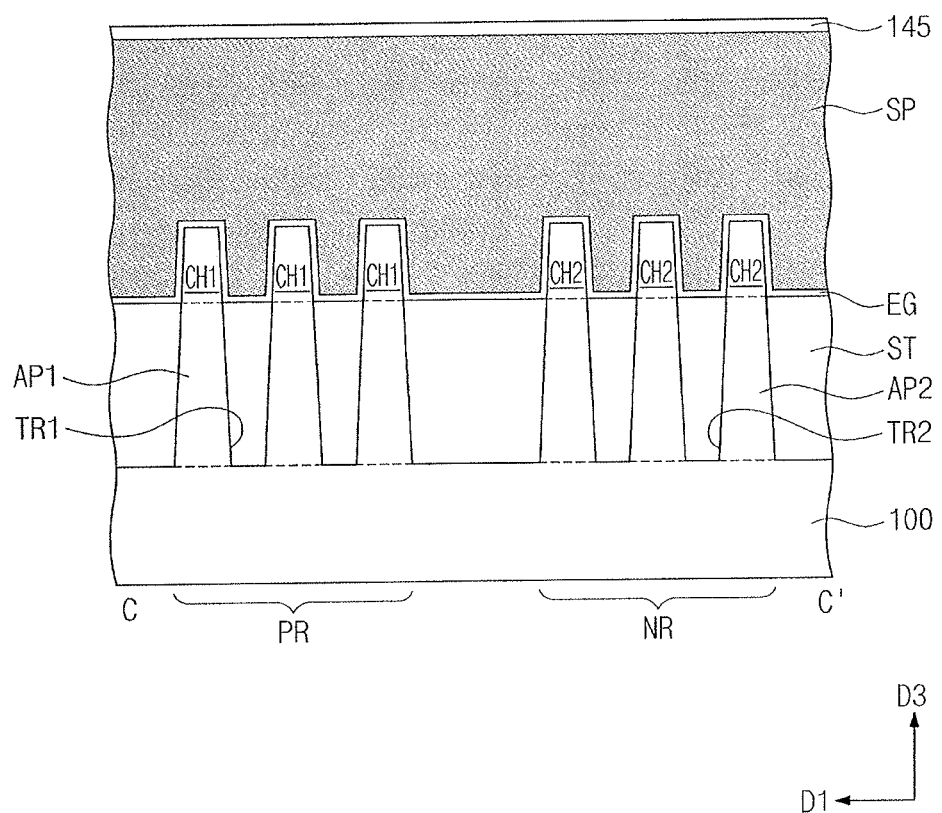
Figure 7D:
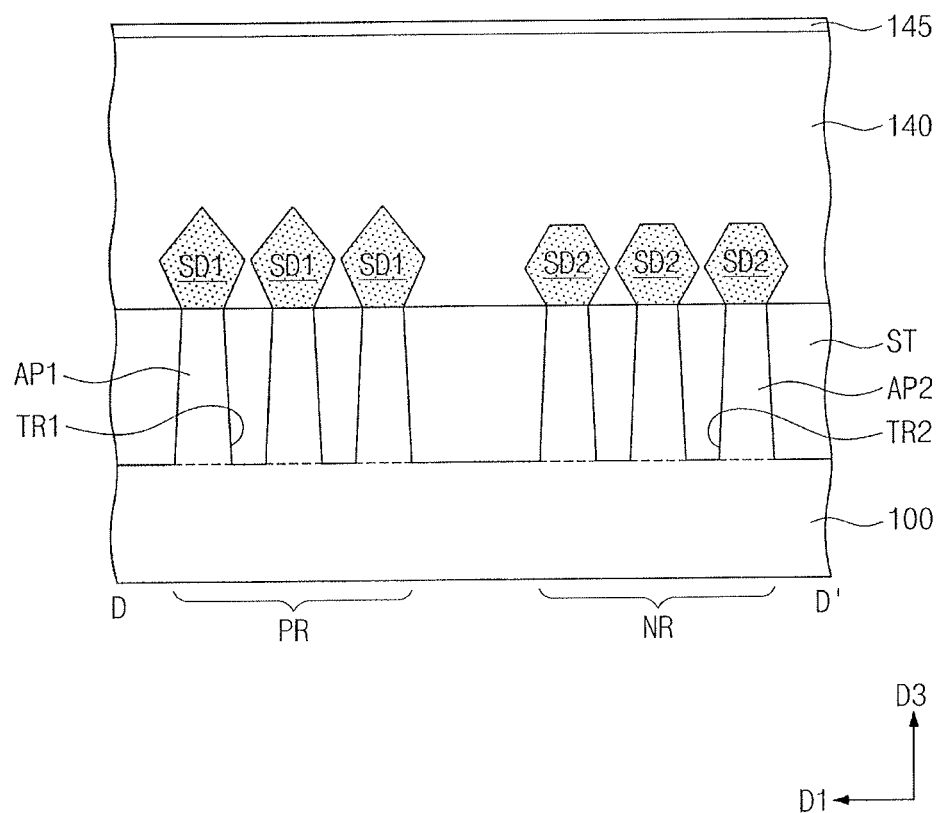
FIGS. 7D, 9D, 11D, 13D, 15D, 17D, 19D, and 21D illustrate cross-sectional views taken along line D-D' of FIGS. 6, 8, 10, 12, 14, 16, 18, and 20, respectively.
Figure 8:
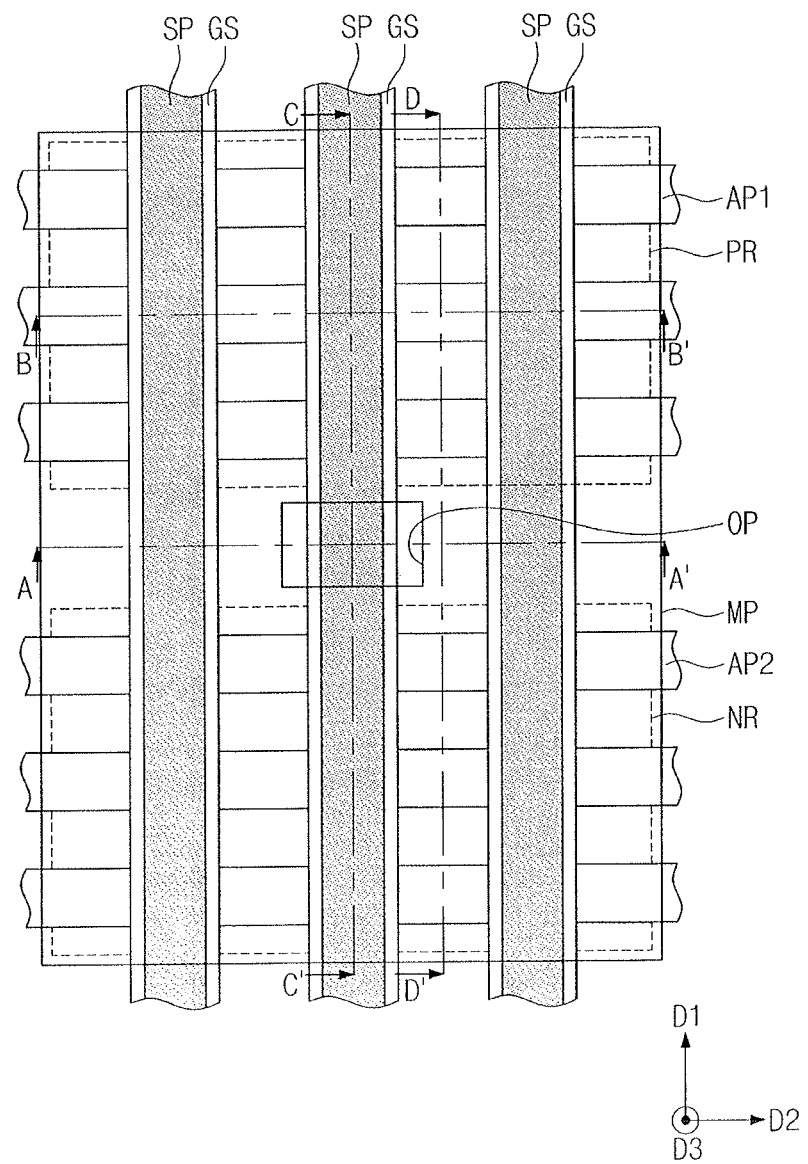
Figure 9A:
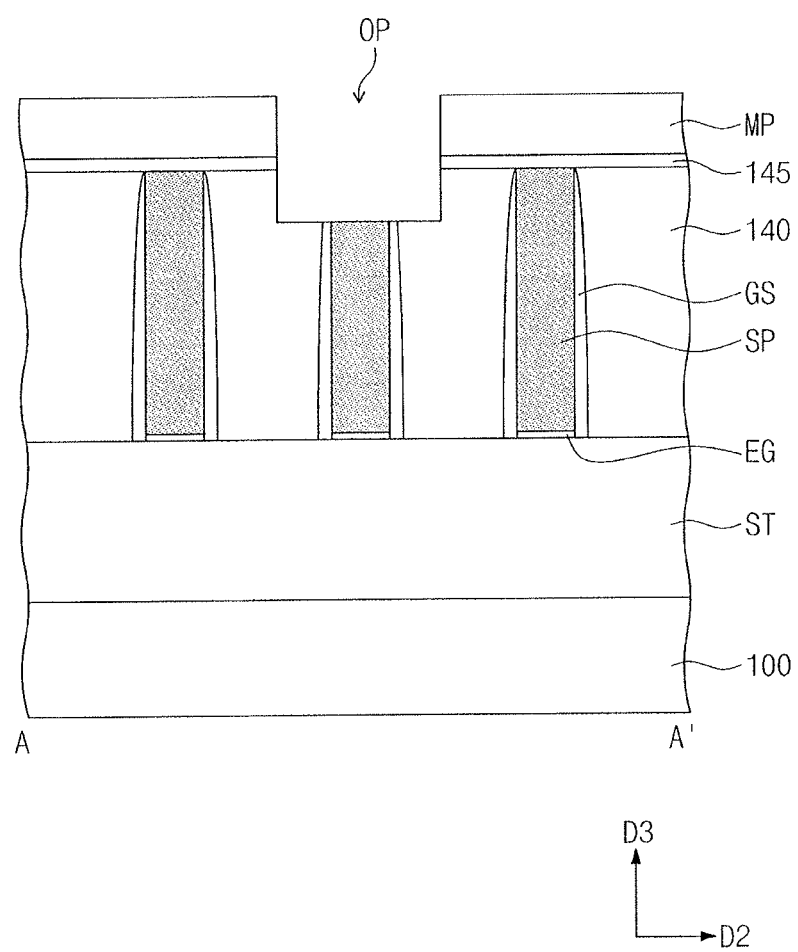
Figure 9B:
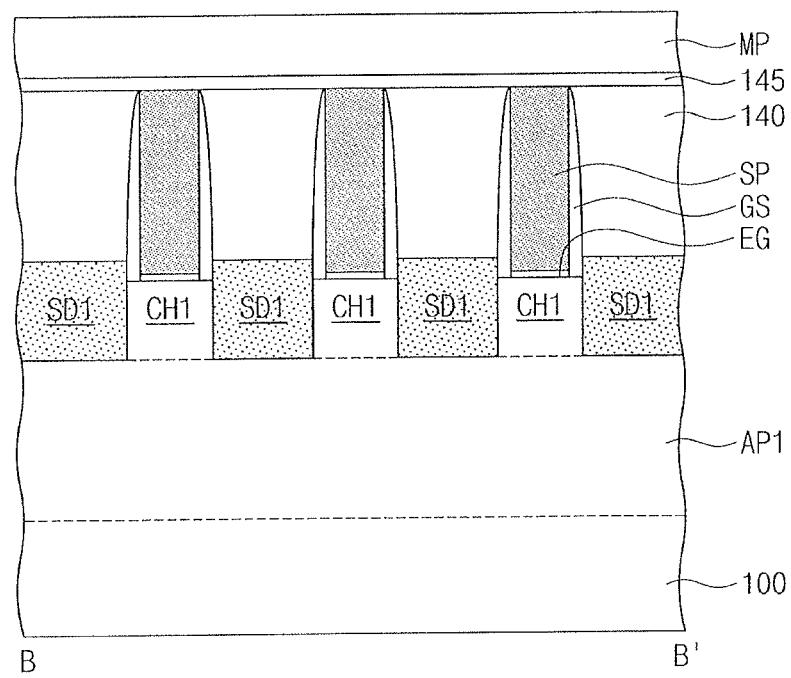
Figure 9B:
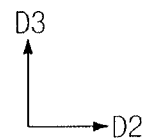
Figure 9C:
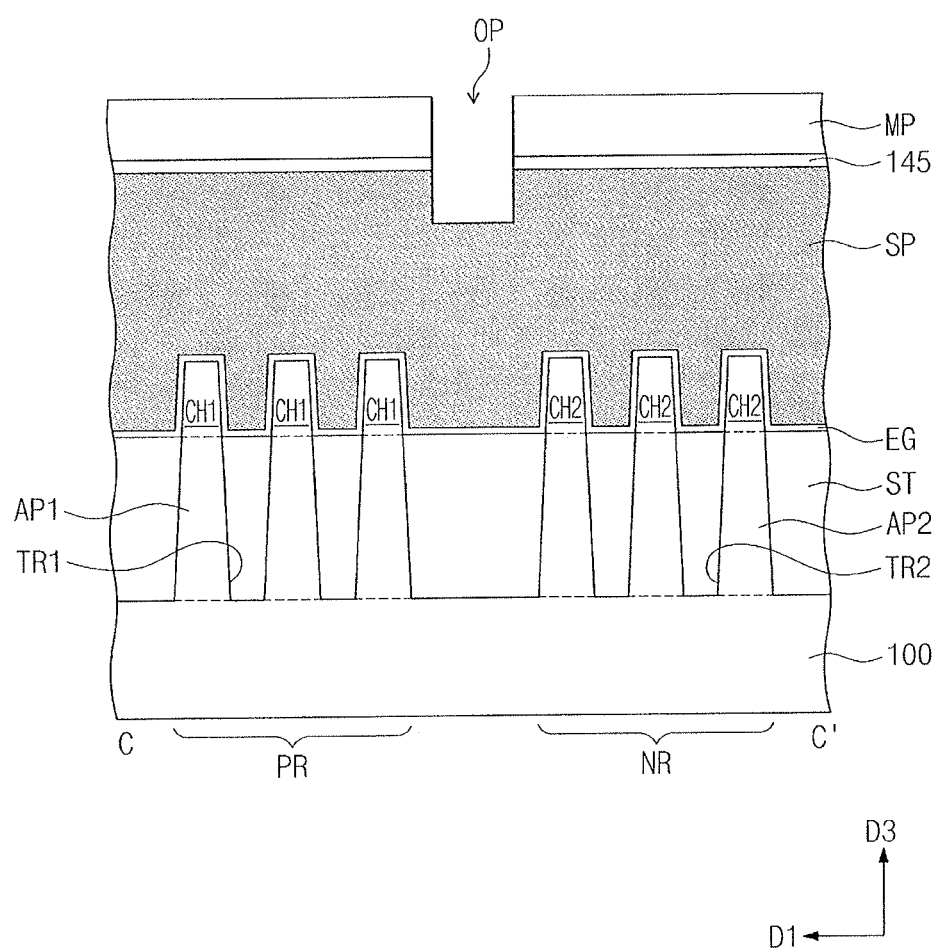
Figure 9D:
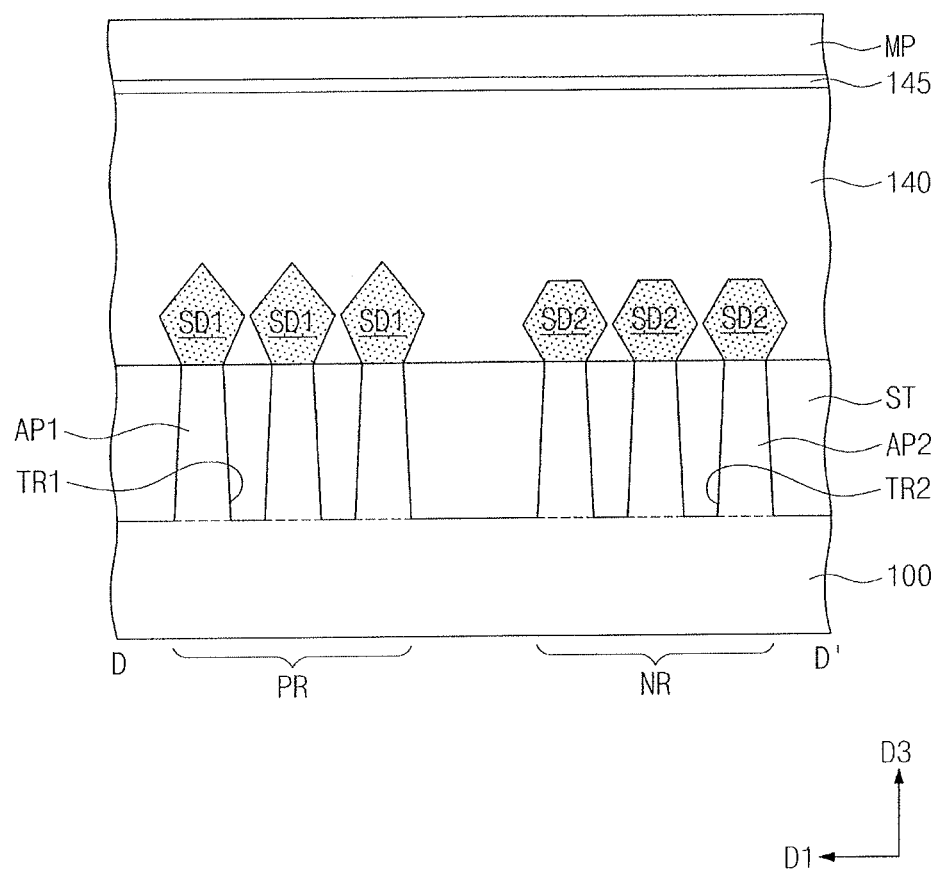

As illustrated in FIG. 2C, the first and second active patterns AP1 and AP2 may have upper portions that vertically protrude above the device isolation layers ST. Each of the upper portions of the first and second active patterns AP1 and AP2 may be shaped like a fin protruding between a pair of the device isolation layers ST.

Figure 2D:
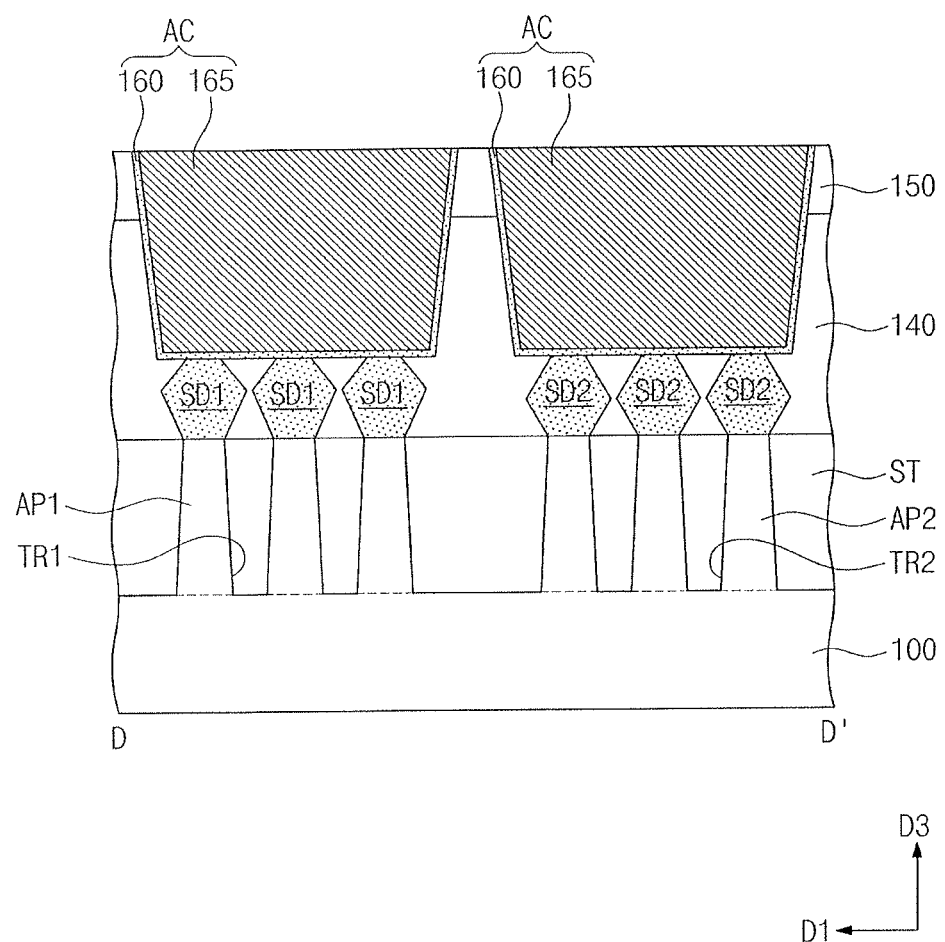

Referring to FIGS. 2C-2D, first channel regions CH1 and first source/drain regions SD1 may be provided at the upper portions of the first active patterns AP1. The first source/drain regions SD1 may be p-type impurity regions. Each of the first channel regions CH1 may be interposed between a pair of the first source/drain regions SD1. Second channel regions CH2 and second source/drain regions SD2 may be provided at the upper portions of the second active patterns AP2. The second source/drain regions SD2 may be n-type impurity regions. Each of the second channel regions CH2 may be interposed between a pair of the second source/drain regions SD2.

The first and second source/drain regions SD1 and SD2 may be epitaxial patterns formed by a selective epitaxial growth process. The first and second source/drain regions SD1 and SD2 may have top surfaces positioned higher than those of the first and second channel regions CH1 and CH2, e.g., relative to a bottom of the substrate 100. The first and second source/drain regions SD1 and SD2 may include a semiconductor element different from that of the substrate 100. For example, the first source/drain regions SD1 may include a semiconductor element whose lattice constant is greater than that of a semiconductor element of the substrate 100. As a result, the first source/drain regions SD1 may provide the first channel regions CH1 with a compressive stress. For example, the second source/drain regions SD2 may include a semiconductor element whose lattice constant is equal to or smaller than that of a semiconductor element of the substrate 100. As a result, the second source/drain regions SD2 may provide the second channel regions CH2 with a tensile stress.

As illustrated in FIG. 1, gate electrodes GE may be provided to extend in the first direction D1 while running across the first and second active patterns AP1 and AP2. The gate electrodes GE may be spaced apart from each other in the second direction D2. The gate electrodes GE may vertically overlap the first and second channel regions CH1 and CH2. Each of the gate electrodes GE may surround the top surface and opposite sidewalls of each of the first and second channel regions CH1 and CH2 (see FIG. 2C). For example, the gate electrodes GE may include one or more of conductive metal nitride (e.g., titanium nitride or tantalum nitride) and metal (e.g., titanium, tantalum, tungsten, copper, or aluminum).

The gate electrodes GE may include a first gate electrode GE1 and a second gate electrode GE2. The first gate electrode GE1 may run across the first active patterns AP1 of the PMOSFET region PR, and the second gate electrode GE2 may run across the second active patterns AP2 of the NMOSFET region NR. The first and second gate electrodes GE1 and GE2 may be aligned side by side in the first direction D1.

As illustrated in FIG. 1, a pair of gate spacers GS may be disposed on opposite sidewalls of each of the gate electrodes GE. The gate spacers GS may extend in the first direction D1 along the gate electrodes GE. As illustrated in FIG. 2B, the gate spacers GS may have top surfaces higher than those of the gate electrodes GE. The top surfaces of the gate spacers GS may be coplanar with a top surface of a first interlayer dielectric layer 140 that will be discussed below. The gate spacers GS may include one or more of, e.g., $SiO_2$, SiCN, SiCON, and SiN. Alternatively, the gate spacers GS may include a multiple layer consisting of two or more of, e.g., $SiO_2$, SiCN, SiCON, and SiN.

The pair of gate spacers GS may include a first gate spacer GS1 and a second gate spacer GS2. The first and second gate electrodes GE1 and GE2 may be interposed between the first and second gate spacers GS1 and GS2. The first gate spacer GS1 may be positioned on a sidewall of each of the first and second gate electrodes GE1 and GE2. The second gate spacer GS2 may be positioned on an opposite sidewall of each of the first and second gate electrodes GE1 and GE2, e.g., each of the first and second gate electrodes GE1 and GE2 may be positioned between the first and second gate spacers GS1 and GS2.

Gate dielectric patterns GI may be interposed between the gate electrodes GE and the first active patterns AP1 and between the gate electrodes GE and the second active patterns AP2. Each of the gate dielectric patterns GI may extend along a bottom surface of each of the gate electrodes GE. Each of the gate dielectric patterns GI may cover the top surface and the opposite sidewalls of each of the first and second channel regions CH1 and CH2. The gate dielectric patterns GI may include a high-k dielectric material. For example, the high-k dielectric material may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

The gate dielectric patterns GI may include a first gate dielectric pattern GI1 and a second gate dielectric pattern GI2. The first gate dielectric pattern GI1 may be interposed between the first gate electrode GE1 and the first active patterns AP1. The second gate dielectric pattern GI2 may be interposed between the second gate electrode GE2 and the second active patterns AP2.

A gate capping pattern GP may be provided on each of the gate electrodes GE. The gate capping patterns GP may extend in the first direction D1 along the gate electrodes GE. The gate capping patterns GP may include a material having an etch selectivity to first and second interlayer dielectric layers 140 and 150 that will be discussed below. In detail, the gate capping patterns GP may include one or more of, e.g., SiON, SiCN, SiCON, and SiN.

As illustrated in FIG. 2A, a first insulation pattern IP and a second insulation pattern DO may be interposed between the first and second gate electrodes GE1 and GE2. The first and second insulation patterns IP and DO may be provided on the device isolation layer ST between the PMOSFET and NMOSFET regions PR and NR. The first and second insulation patterns IP and DO may vertically overlap the device isolation layer ST. The first and second insulation patterns IP and DO may separate the first and second gate electrodes GE1 and GE2 from each other. For example, the first insulation pattern IP may include silicon nitride or silicon oxynitride, and the second insulation pattern DO may include silicon oxide.

The second gate electrode GE2, the first insulation pattern IP, and the first gate electrode GE1 may be arranged in the first direction D1. In other words, the second gate electrode GE2, the first insulation pattern IP, and the first gate electrode GE1 may be aligned with each other in the first direction D1 (see FIGS. 1 and 3). The first and second insulation patterns IP and DO may also be interposed between the first and second gate spacers GS1 and GS2.

The first insulation pattern IP may have first to fourth sidewalls SW1 to SW4. The first and second sidewalls SW1 and SW2 may be parallel to the second direction D2, e.g., in the D2-D3 plane, and opposite to each other. The third and fourth sidewalls SW3 and SW4 may be parallel to the first direction D1, e.g., in the D1-D3 plane, and opposite to each other.

As illustrated in FIG. 3, the second insulation pattern DO may, e.g., continuously, cover a bottom surface, the third sidewall SW3, and the fourth sidewall SW4 of the first insulation pattern IP. The second insulation pattern DO may not cover a top surface, the first sidewall SW1, and the second sidewall SW2 of the first insulation pattern IP. That is, the first insulation pattern IP may have a "U" shape (see FIGS. 2A and 3).

As illustrated in FIG. 2C, the first and second gate electrodes GE1 and GE2 may have top surfaces substantially coplanar with top surfaces of the first and second insulation patterns IP and DO. In an embodiment, the bottom surface of the first insulation pattern IP may be located higher, e.g., relative to a bottom of the substrate 100, than a lowermost bottom surface of each of the first and second gate electrodes GE1 and GE2. A shallow recessed region RG may be included in the device isolation layers ST below the first and second gate electrodes GE1 and GE2 (FIG. 2A). Accordingly, the device isolation layer ST below the second insulation pattern DO may have a top surface higher than that of the shallow recessed region RG.

The first gate electrode GE1 may face the first sidewall SW1, and the second gate electrode GE2 may face the second sidewall SW2 (see FIGS. 2C and 3). The first gate dielectric pattern GI1 may vertically extend while being interposed between the first gate electrode GE1 and the first insulation pattern IP. The first gate dielectric pattern GI1 may cover the first sidewall SW1. The second gate dielectric pattern GI2 may vertically extend while being interposed between the second gate electrode GE2 and the first insulation pattern IP. The second gate dielectric pattern GI2 may cover the second sidewall SW2.

As illustrated in FIGS. 2B and 2D, the first interlayer dielectric layer 140 may be provided on the substrate 100. The first interlayer dielectric layer 140 may cover the gate spacers GS, the first source/drain regions SD1, and the second source/drain regions SD2. The first interlayer dielectric layer 140 may have a top surface substantially coplanar with top surfaces of the gate capping patterns GP and the top surfaces of the gate spacers GS. The first interlayer dielectric layer 140 may be provided with a second interlayer dielectric layer 150 thereon covering the gate capping patterns GP.

In addition, as illustrated in FIGS. 1 and 2B, a pair of the gate electrodes GE may be provided therebetween with one or more contacts AC that penetrate the first and second interlayer dielectric layers 140 and 150 and are electrically connected to the first and second source/drain regions SD1 and SD2. For example, each of the contacts AC may be connected to a plurality of the first or second source/drain regions SD1 or SD2. In another example, at least one contact AC may be connected to a single first or second source/drain region SD1 or SD2, but embodiments are not especially limited thereto.

Each of the contacts AC may include a conductive pillar 165 and a barrier layer 160 surrounding the conductive pillar 165. The barrier layer 160 may cover sidewalls and a bottom surface of the conductive pillar 165. The conductive pillar 165 may include a metallic material, e.g., tungsten. The barrier layer 160 may include metal nitride, e.g., Ti/TiN.

Silicide layers may be interposed between the contacts AC and the first source/drain regions SD1 and between the contacts AC and the second source/drain regions SD2. That is, the contacts AC may be electrically connected through the silicide layers to the first and second source/drain regions SD1 and SD2. The silicide layers may include metal silicide, e.g., one or more of titanium silicide, tantalum silicide, and tungsten silicide.

In a semiconductor device according to the present disclosure, the first and second insulation patterns IP and DO may completely insulate the first and second gate electrodes GE1 and GE2 from each other. As a relatively large distance CTF is secured, e.g., defined, between the first insulation pattern IP and its neighboring active patterns AP1 and AP2 (FIG. 2C), the first and second gate electrodes GE1 and GE2 may be formed in spaces between the first insulation pattern IP and its neighboring active patterns AP1 and AP2, e.g., within the defined distance CTF. Thus, a transistor may have enhanced electrical characteristics. As the first insulation pattern IP has a strong etch resistance, an electrical short may be prevented between the contacts AC adjacent to each other when the contacts AC are self-alignedly formed.

FIGS. 4, 6, 8, 10, 12, 14, 16, 18, and 20 are plan views for explaining a method of manufacturing a semiconductor device according to exemplary embodiments. FIGS. 5A, 7A, 9A, 11A, 13A, 15A, 17A, 19A, and 21A are cross-sectional views taken along line A-A' of FIGS. 4, 6, 8, 10, 12, 14, 16, 18, and 20, respectively. FIGS. 5B, 7B, 9B, 11B, 13B, 15B, 17B, 19B, and 21B are cross-sectional views taken along line B-B' of FIGS. 4, 6, 8, 10, 12, 14, 16, 18, and 20, respectively. FIGS. 5C, 7C, 9C, 11C, 13C, 15C, 17C, 19C, and 21C are cross-sectional views taken along line C-C' of FIGS. 4, 6, 8, 10, 12, 14, 16, 18, and 20, respectively. FIGS. 7D, 9D, 11D, 13D, 15D, 17D, 19D, and 21D are cross-sectional views taken along line D-D' of FIGS. 6, 8, 10, 12, 14, 16, 18, and 20, respectively.

Referring to FIGS. 4 and 5A to 5C, the substrate 100 may be patterned to form the active patterns AP1 and AP2. The active patterns AP1 and AP2 may include the first active patterns AP1 and the second active patterns AP2. In detail, the formation of the first and second active patterns AP1 and AP2 may include forming mask patterns on the substrate 100 and anisotropically etching the substrate 100 using the mask patterns as an etch mask. The first trenches TR1 may be formed between the first active patterns AP1. The second trenches TR2 may be formed between the second active patterns AP2. The substrate 100 may be a compound semiconductor substrate or a semiconductor substrate including, e.g., silicon, germanium, silicon-germanium, and so forth.

Device isolation layers ST may be formed to fill the first and second trenches TR1 and TR2. In detail, an insulation layer (e.g., a silicon oxide layer) may be formed to fill all of the first and second trenches TR1 and TR2. Thereafter, the insulation layer may be recessed until exposing upper portions of the first and second active patterns AP1 and AP2. The first active patterns AP1 may constitute a PMOSFET region PR, and the second active patterns AP2 may constitute an NMOSFET region NR.

A liner layer EG may be formed on an entire surface of the substrate 100. The liner layer EG may cover top surfaces of the device isolation layers ST. The first and second active patterns AP1 and AP2 may have their upper portions, which are exposed between the device isolation layers ST and covered with the liner layer EG. For example, the liner layer EG may include a silicon oxide layer.

Referring to FIGS. 6 and 7A to 7D, sacrificial patterns SP may be formed to run across the first and second active patterns AP1 and AP2. The sacrificial patterns SP may be formed to have a shape of line or bar extending in the first direction D1. In detail, the formation of the sacrificial patterns SP may include forming a sacrificial layer on the entire surface of the substrate 100 and patterning the sacrificial layer. The sacrificial layer may include, e.g., a polysilicon layer.

A pair of gate spacers GS may be formed on opposite sidewalls of each of the sacrificial patterns SP. The formation of the gate spacers GS may include conformally forming a spacer layer on the entire surface of the substrate 100 and anisotropically etching the spacer layer. The spacer layer may include one or more of, e.g., $SiO_2$, SiCN, SiCON, and SiN. Alternatively, the spacer layer may include a multiple layer consisting of two or more of $SiO_2$, SiCN, SiCON, and SiN.

The first and second source/drain regions SD1 and SD2 may be formed on opposite sides of each of the sacrificial patterns SP. The first and second source/drain regions SD1 and SD2 may be formed by a selective epitaxial growth process that uses the substrate 100 as a seed layer. For example, the epitaxial growth process may include chemical vapor deposition (CVD) or molecular beam epitaxy (MBE).

An etch process may be first performed to selectively etch the first and second active patterns AP1 and AP2 on the opposite sides of each of the sacrificial patterns SP. An etched upper portion of the first active pattern AP1 may be used as a seed layer from which the first source/drain region SD1 is formed, and an etched upper portion of the second active pattern AP2 may be used as a seed layer from which the second source/drain region SD2 is formed. As the first source/drain regions SD1 are formed, the first channel region CH1 may be defined between a pair of the first source/drain regions SD1. Likewise, as the second source/drain regions SD2 are formed, the second channel region CH2 may be defined between a pair of the second source/drain regions SD2.

The first source/drain regions SD1 may be doped with p-type impurities, and the second source/drain regions SD2 may be doped with n-type impurities. For example, impurities may be in-situ doped when the first and second source/drain regions SD1 and SD2 are formed. Alternatively, after the first and second source/drain regions SD1 and SD2 are formed, impurities may be doped into the first and second source/drain regions SD1 and SD2.

Successively, the first interlayer dielectric layer 140 may be formed to cover the first and second source/drain regions SD1 and SD2, the sacrificial patterns SP, and the gate spacers GS. For example, the first interlayer dielectric layer 140 may include a silicon oxide layer. After that, the first interlayer dielectric layer 140 may be planarized until exposing top surfaces of the sacrificial patterns SP. An etch-back or chemical mechanical polishing (CMP) process may be performed to planarize the first interlayer dielectric layer 140. As a result, the first interlayer dielectric layer 140 may have a top surface substantially coplanar with the top surfaces of the sacrificial patterns SP and top surfaces of the gate spacers GS.

An etch stop layer 145 may be formed on the first interlayer dielectric layer 140. The etch stop layer 145 may cover the top surfaces of the sacrificial patterns SP. For example, the etch stop layer 145 may include a silicon nitride layer.

Referring to FIGS. 8 and 9A to 9D, a mask pattern MP having an opening OP may be formed on the etch stop layer 145. The formation of the mask pattern MP may include forming a mask layer on the etch stop layer 145, forming a photoresist layer on the mask layer, and etching the mask layer using the photoresist pattern as an etch mask. The opening OP may define a position where the first and second insulation patterns IP and DO are to be formed, as discussed above with reference to FIGS. 1, 2A to 2D, and 3. The opening OP may be formed on the device isolation layer ST between the PMOSFET and NMOSFET regions PR and NR.

The mask pattern MP may be used as an etch mask to etch the etch stop layer 145 and an upper portion of the sacrificial pattern SP. In this step, etching may also be performed on a portion of the first interlayer dielectric layer 140 and portions of the gate spacers GS. The opening OP may partially expose the top surface of the sacrificial pattern SP.

Referring to FIGS. 10 and 11A to 11D, an anisotropic etch process may be performed on the sacrificial pattern SP exposed through the opening OP. The anisotropic etch process may selectively etch the sacrificial pattern SP. The sacrificial pattern SP may have therein a hollow space, which is created by the anisotropic etch process performed on a portion of the sacrificial pattern SP and is spatially connected to the opening OP. Afterwards, the liner layer EG may be etched to selectively remove its portion exposed through the opening OP. The opening OP may partially expose the top surface of the device isolation layer ST. The opening OP may divide the sacrificial pattern SP into a first sacrificial pattern SP1 and a second sacrificial pattern SP2. The first and second sacrificial patterns SP1 and SP2 may be spaced apart from each other in the first direction D1 across the opening OP. The first sacrificial pattern SP1 may run across the first active patterns AP1, and the second sacrificial pattern SP2 may run across the second active patterns AP2.

Referring to FIGS. 12 and 13A to 13D, a lower insulation layer DL and an upper insulation layer IL may be sequentially formed to fill the opening OP. The lower insulation layer DL may be conformally formed by, e.g., an atomic layer deposition (ALD) process. The lower insulation layer DL may cover sidewalls and bottom of the opening OP, e.g., the lower insulation layer DL may have a uniform thickness on the sidewalls and bottom of the opening OP. The lower insulation layer DL may not completely fill the opening OP. The upper insulation layer IL may be formed using a deposition process exhibiting superior gap-fill characteristics (e.g., ALD or CVD). The upper insulation layer IL may be formed on the lower insulation layer DL to completely fill the opening OP. For example, the lower insulation layer DL may include a silicon oxide layer, and the upper insulation layer IL may include a silicon nitride layer or a silicon oxynitride layer.

Referring to FIGS. 14 and 15A to 15D, a planarization process may be preformed until exposing the top surfaces of the sacrificial patterns SP. The planarization process may remove the mask pattern MP and the etch stop layer 145. The planarization process may transform the upper insulation layer IL into the first insulation pattern IP. The first insulation pattern IP may have a top surface substantially coplanar with the top surfaces of the sacrificial patterns SP. The lower insulation layer DL may cover the bottom surface and the sidewalls of the first insulation pattern IP. The first insulation pattern IP and the lower insulation layer DL may be interposed between the first and second sacrificial patterns SP1 and SP2, e.g., along the first direction D1.

Figure 17A:
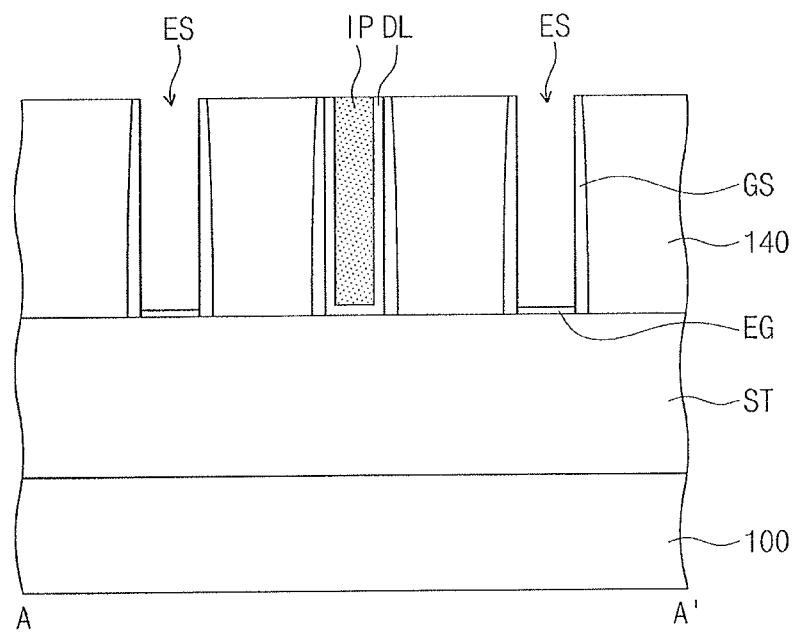
Figure 17A:
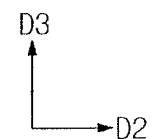
Figure 17B:
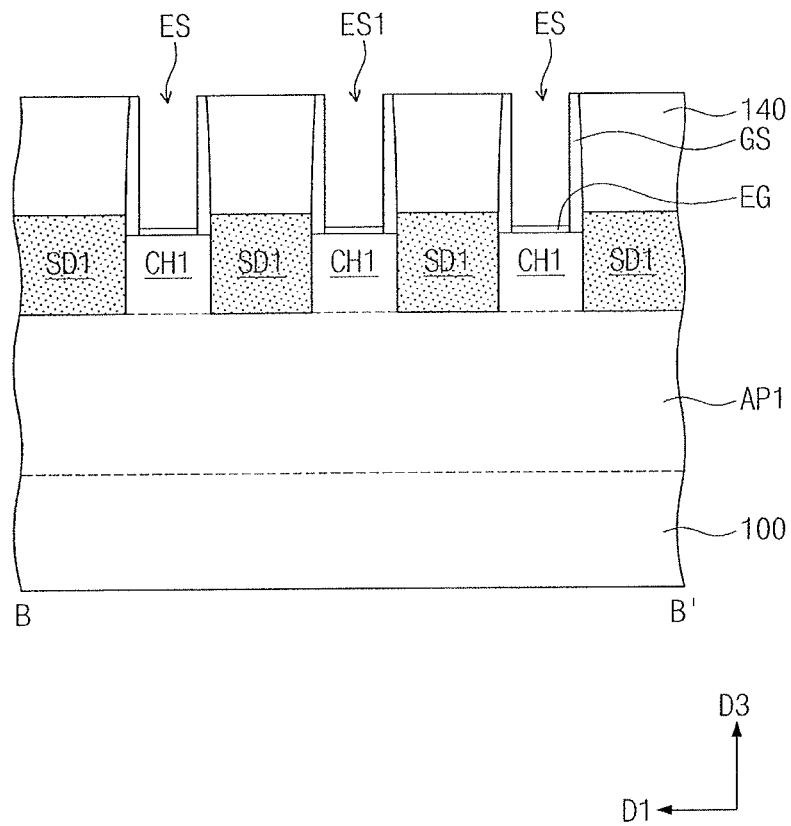
Figure 17C:
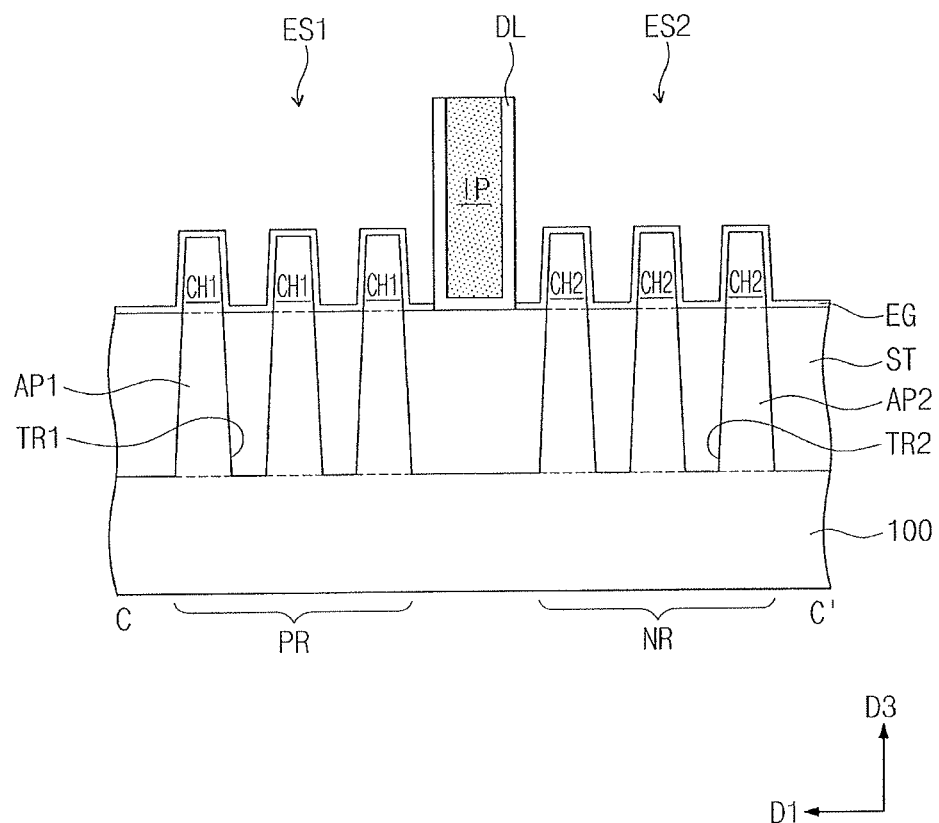
Figure 17D:
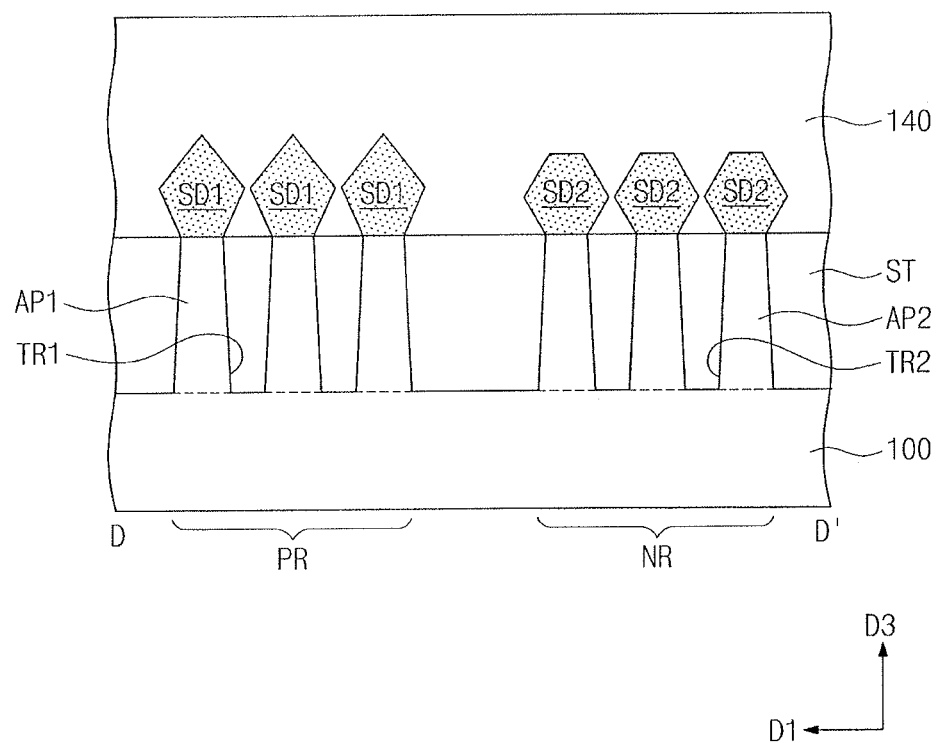

Referring to FIGS. 16 and 17A to 17D, an anisotropic etch process may be performed on the exposed sacrificial patterns SP. The anisotropic etch process may selectively etch the sacrificial patterns SP, e.g., to remove the sacrificial patterns SP. The removal of the sacrificial patterns SP may form empty spaces ES. The empty spaces ES may expose the liner layer EG. The empty spaces ES may include a first empty space ES1 formed when the first sacrificial pattern SP1 is removed and a second empty space ES2 formed when the second sacrificial pattern SP2 is removed. The first and second empty spaces ES1 and ES2 may expose sidewalls of the lower insulation layer DL (FIG. 17C).

Figure 18:
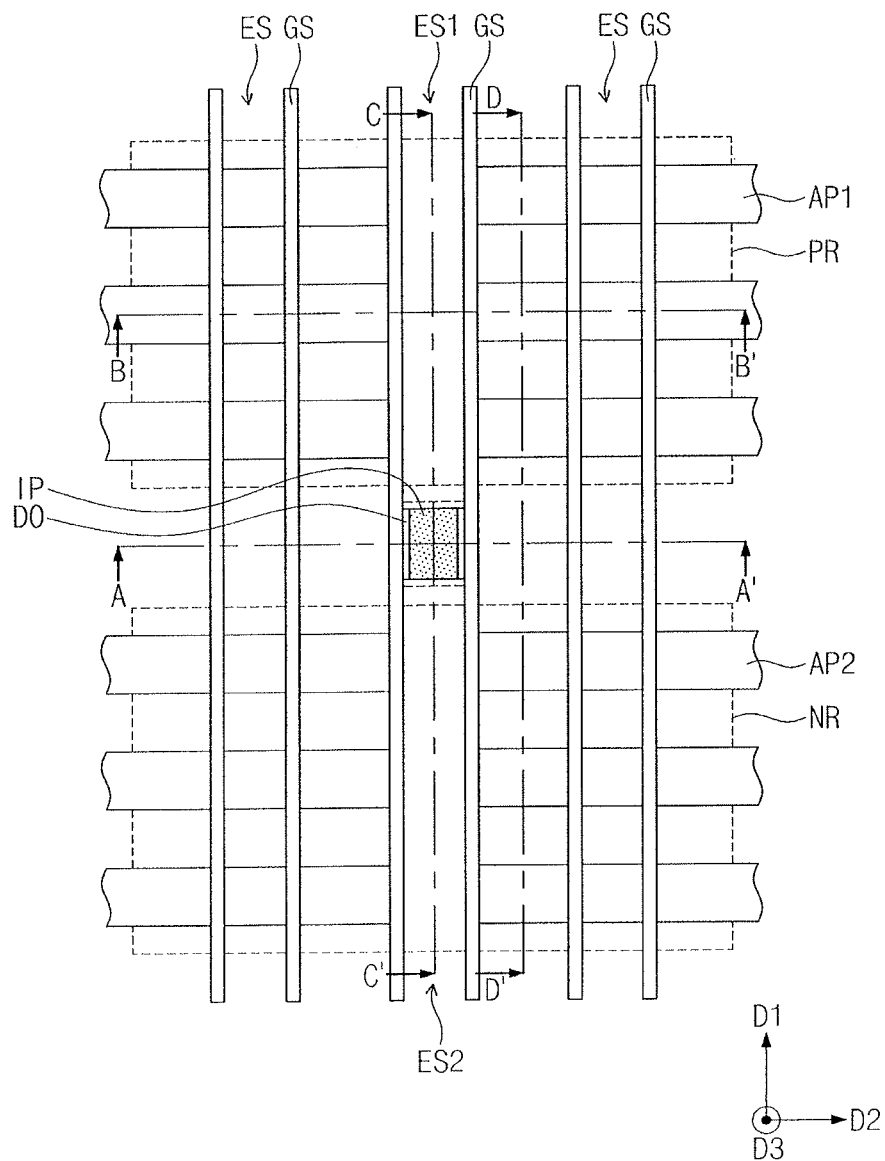

Referring to FIGS. 18 and 19A to 19D, an isotropic etch process may be performed to remove the liner layer EG, e.g., from the bottom of the empty spaces ES and from surfaces of the active patterns, exposed through the empty spaces ES. As discussed above, all of the liner layer EG, the lower insulation layer DL, and the device isolation layers ST may include the same material (e.g., a silicon oxide layer). Therefore, during the isotropic etch process that removes the liner layer EG, the lower insulation layer DL, e.g., exposed by the empty spaces ES in FIG. 17C, may be etched as well to remove its portion (designated by a dotted line of FIGS. 18 and 19C) exposed through the first and second empty spaces ES1 and ES2 to form the second insulation pattern DO. For example, as illustrated in FIG. 18, portions of the lower insulation layer DL exposed by the empty spaces ES1 and ES2, i.e., portions of the lower insulation layer DL adjacent to the first insulation pattern IP along the first direction D1 (indicated by dashed lines), may be removed, while portions of the lower insulation layer DL between the first insulation pattern IP and the gate spacers GS, i.e., portions of the lower insulation layer DL adjacent to the first insulation pattern IP along the second direction D2, may remain to define the second insulation pattern DO.

As the lower insulation layer DL is partially removed, the sidewalls of the first insulation pattern IP may be exposed through the first and second empty spaces ES1 and ES2. The partial removal of the lower insulation layer DL may cause the first and second empty spaces ES1 and ES2 to have an increased length in the first direction D1 by a first distance L1. The first distance L1 may be the same as a thickness of the lower insulation layer DL.

Figure 19A:
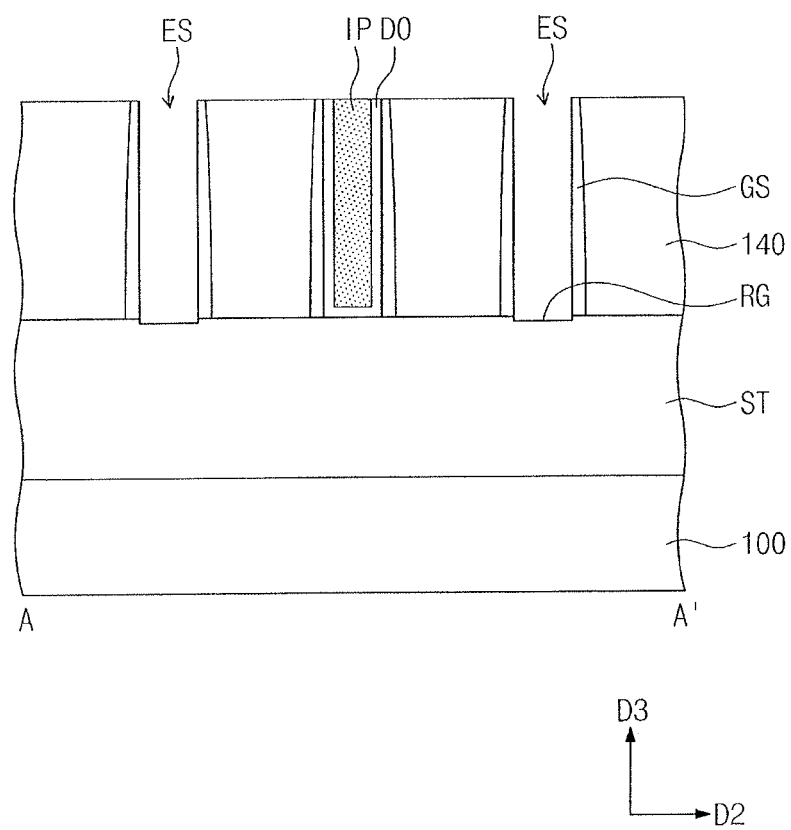
Figure 19B:
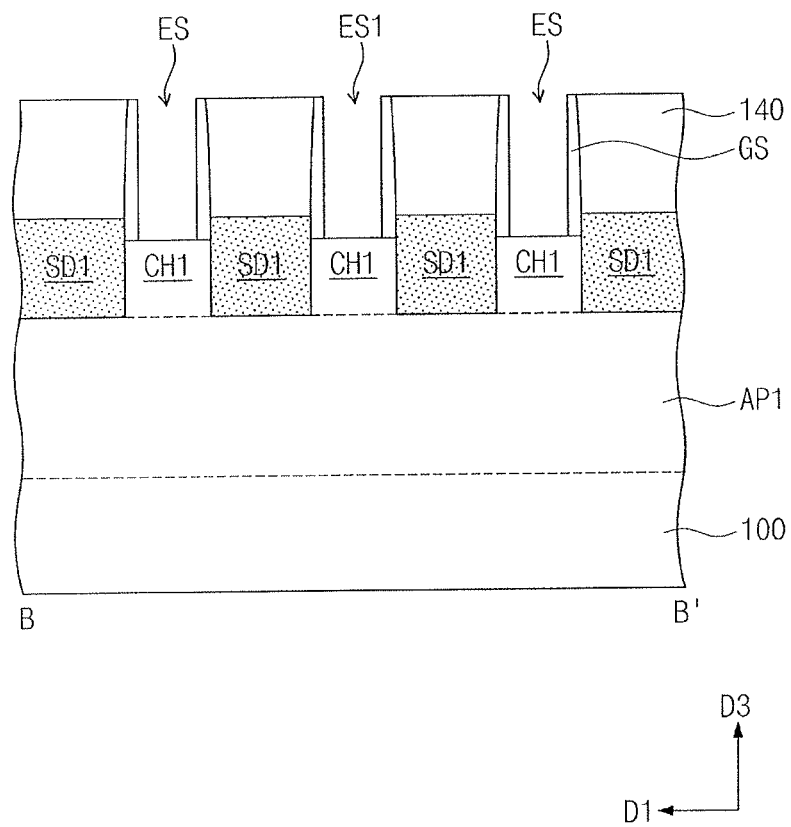
Figure 19C:
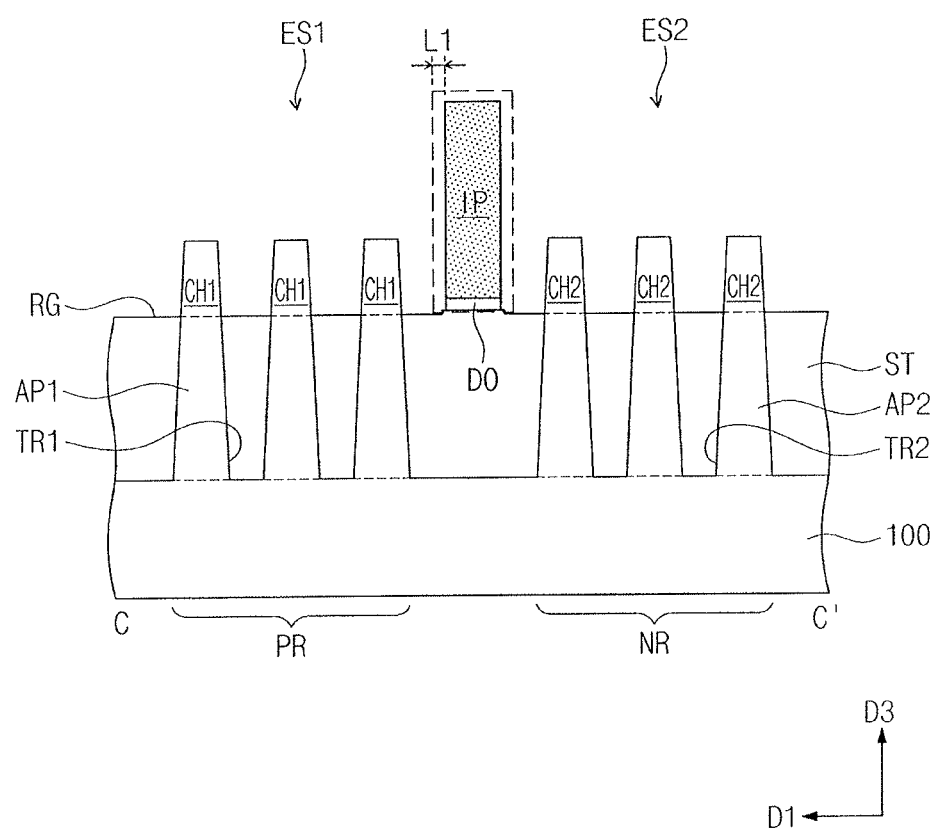
Figure 19D:
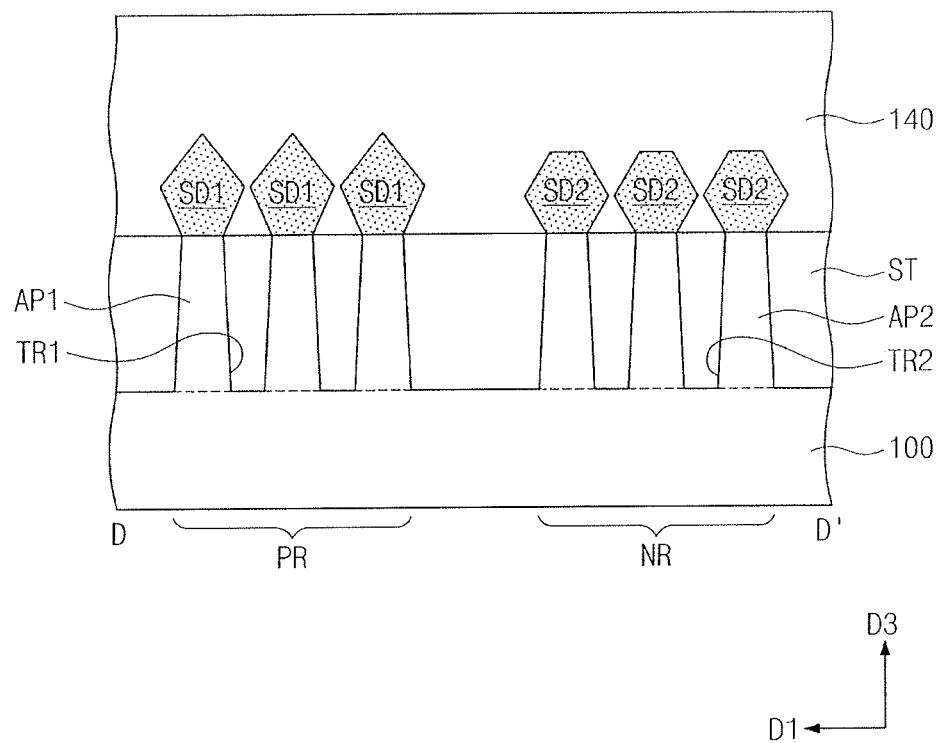
Figure 20:
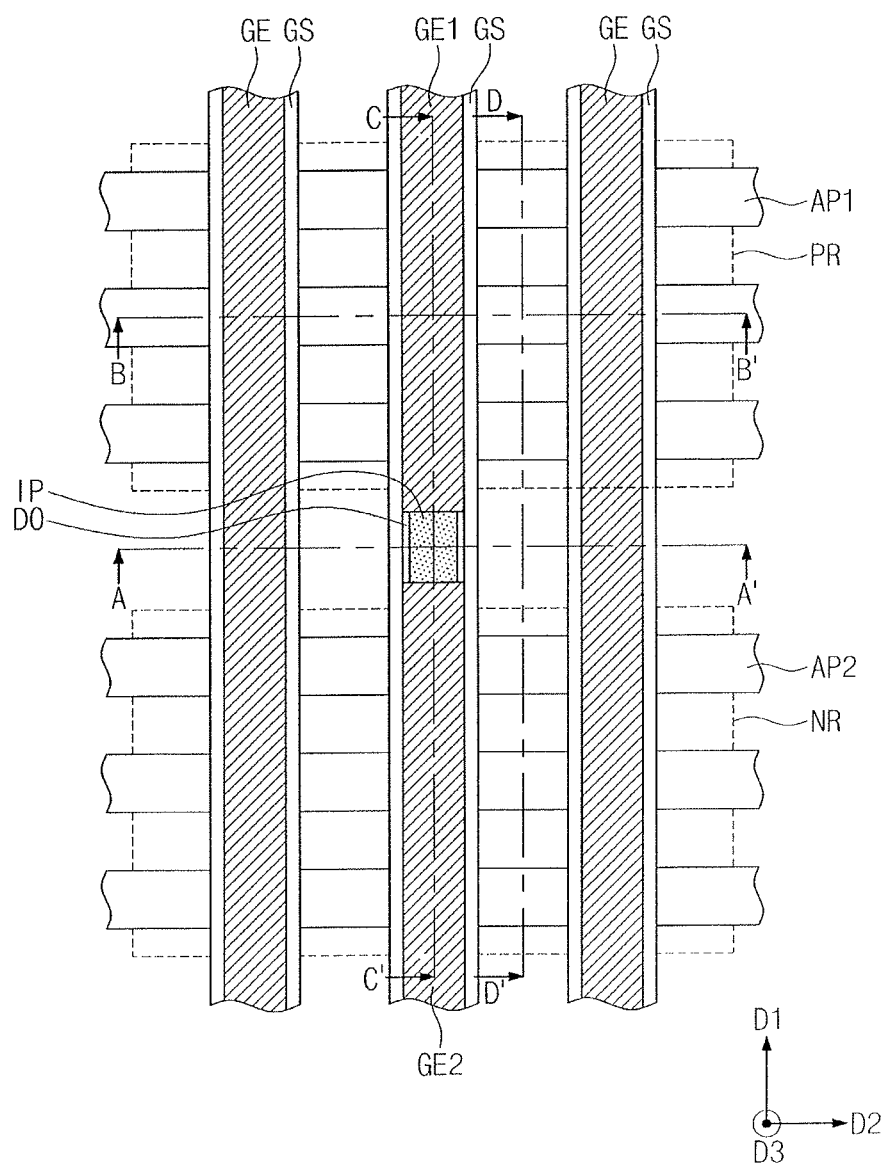
Figure 21A:
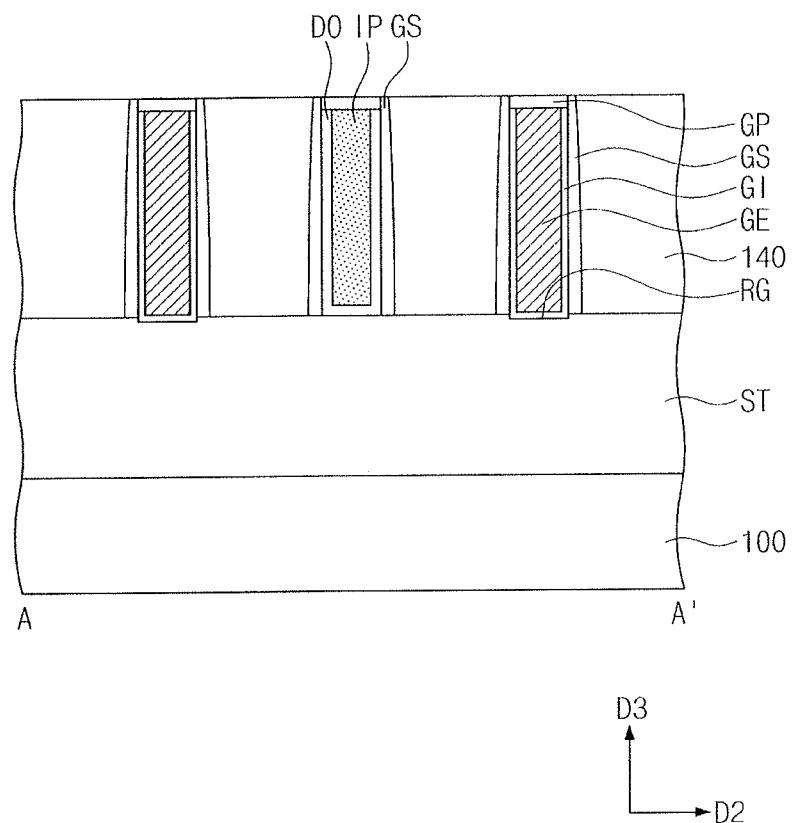
Figure 21B:
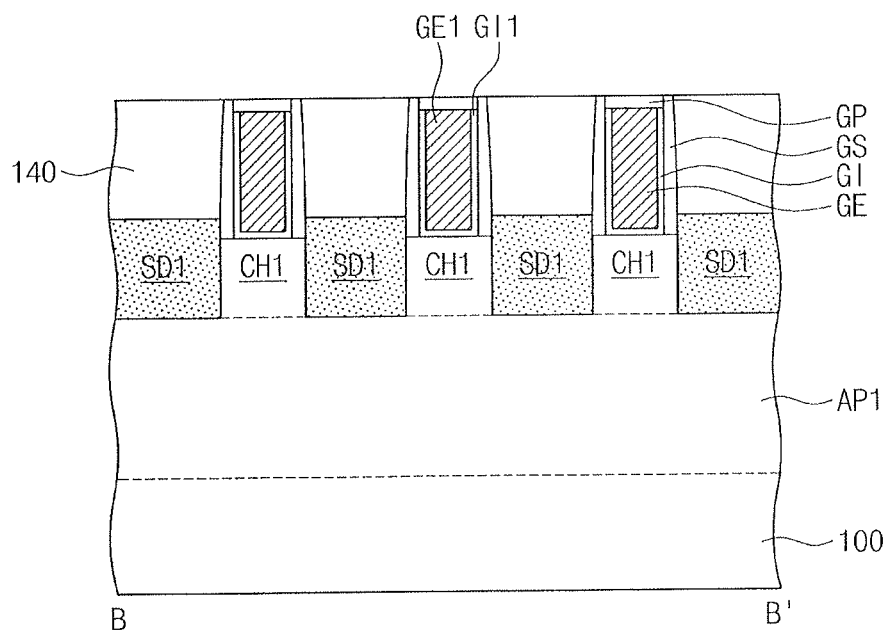
Figure 21C:
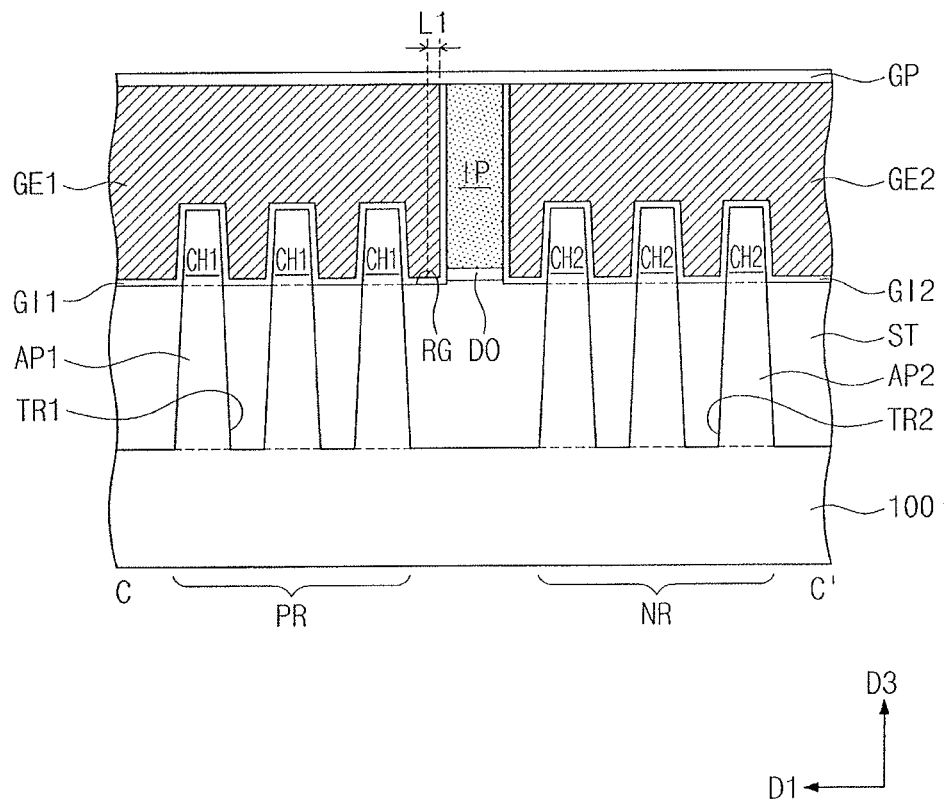
Figure 21D:
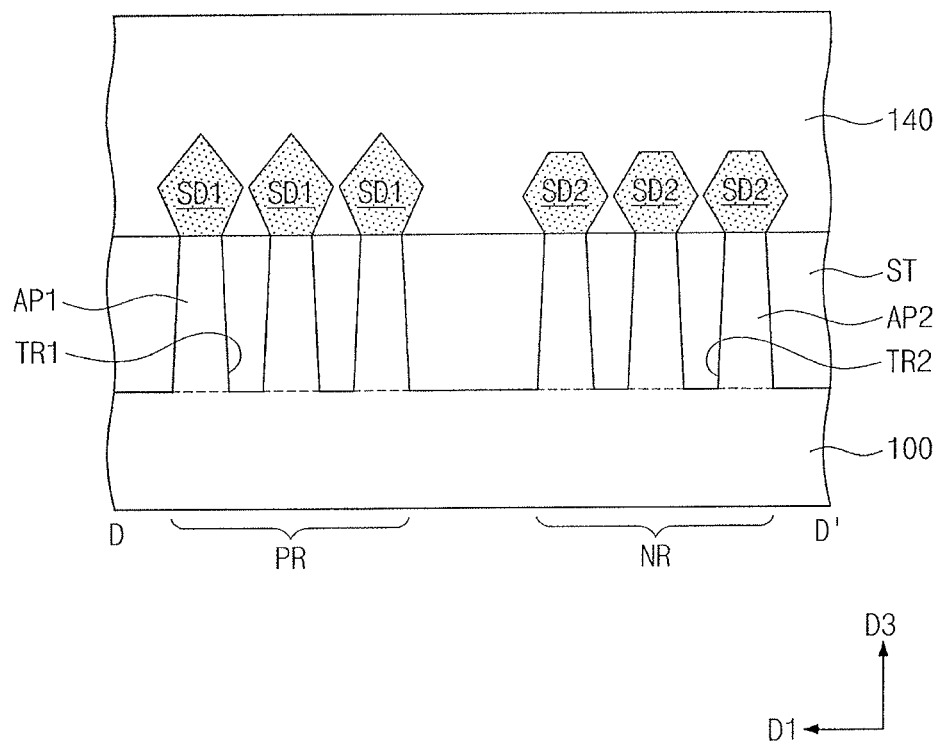

The device isolation layers ST may be also partially etched on their upper portions during the isotropic etch process of the liner layer EG, and thus the shallow recessed region RG may be formed, e.g., to increase the depths of the empty spaces ES. Accordingly, the device isolation layer ST below the second insulation pattern DO may have a top surface higher than that of the shallow recessed region RG (FIG. 19A).

Referring to FIGS. 20 and 21A to 21D, the gate dielectric pattern GI, the gate electrode GE, and the gate capping pattern GP may be formed in each of the empty spaces ES. The gate dielectric pattern GI may be conformally formed not to completely fill the empty space ES. The gate dielectric pattern GI may be formed by atomic layer deposition (ALD) or chemical oxidation. For example, the gate dielectric pattern GI may include a high-k dielectric material. The high-k dielectric material may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

First and second gate dielectric patterns GI1 and GI2 may be formed in the first and second empty spaces ES1 and ES2, respectively. The first gate dielectric pattern GI1 may cover a sidewall of the first insulation pattern IP. The second gate dielectric pattern GI2 may cover an opposite sidewall of the first insulation pattern IP.

The gate electrode GE may be formed by forming a gate electrode layer to completely fill the empty space ES above the gate dielectric pattern GI, and planarizing the gate electrode layer. For example, the gate electrode layer may include one or more of conductive metal nitride (e.g., titanium nitride or tantalum nitride) and metal (e.g., titanium, tantalum, tungsten, copper, or aluminum).

First and second gate electrodes GE1 and GE2 may be formed in the first and second empty spaces ES1 and ES2, respectively. Since the lower insulation layer DL is partially removed as discussed above, each of the first and second gate electrodes GE1 and GE2 may be formed in a space whose length is increased by the first distance L1. Accordingly, the first gate electrode GE1 may be formed in a space between the first insulation pattern IP and its neighboring first active pattern AP1, and the second gate electrode GE2 may be formed in a space between the first insulation pattern IP and its neighboring second active pattern AP2. As a result, it may be possible to enhance electrical characteristics of transistors including the first and second gate electrodes GE1 and GE2.

Subsequently, the gate electrodes GE may be recessed on their upper portions. The first and second insulation patterns IP and DO may also be recessed on their upper portions. The gate capping patterns GP may be formed on the gate electrodes GE and the first insulation pattern IP. The gate capping patterns GP may be formed to completely fill recess regions of the gate electrodes GE and a recessed region of the first insulation pattern IP. The gate capping patterns GP may include one or more of SiON, SiCN, SiCON, and SiN.

Referring back to FIGS. 1 and 2A to 2D, the second interlayer dielectric layer 150 may be formed on the first interlayer dielectric layer 140 and the gate capping patterns GP. The second interlayer dielectric layer 150 may include, e.g., a silicon oxide layer or a low-k oxide layer. For example, the low-k oxide layer may include a carbon-doped silicon oxide layer such as SiCOH. A chemical vapor deposition (CVD) process may be performed to form the second interlayer dielectric layer 150.

Contact holes may be formed to penetrate the second and first interlayer dielectric layers 150 and 140 in such a way that the first and second source/drain regions SD1 and SD2 are exposed through the contact holes. For example, the contact holes may be self-aligned contact holes that are self-aligned by the gate capping patterns GP, the gate spacers GS, and the first insulation pattern IP.

The contact holes may be provided therein with contacts AC in contact with the first and second source/drain regions SD1 and SD2. Each of the contacts AC may include the conductive pillar 165 and the barrier layer 160 surrounding the conductive pillar 165. In detail, the barrier layer 160 may be formed to partially fill the contact holes. After that, a conductive layer may be formed to completely fill the contact holes, and a planarization process may be performed until exposing a top surface of the second interlayer dielectric layer 150. The barrier layer 160 may include metal nitride, e.g., Ti/TiN, and the conductive pillar 165 may include metal, e.g., tungsten.

Figure 22:
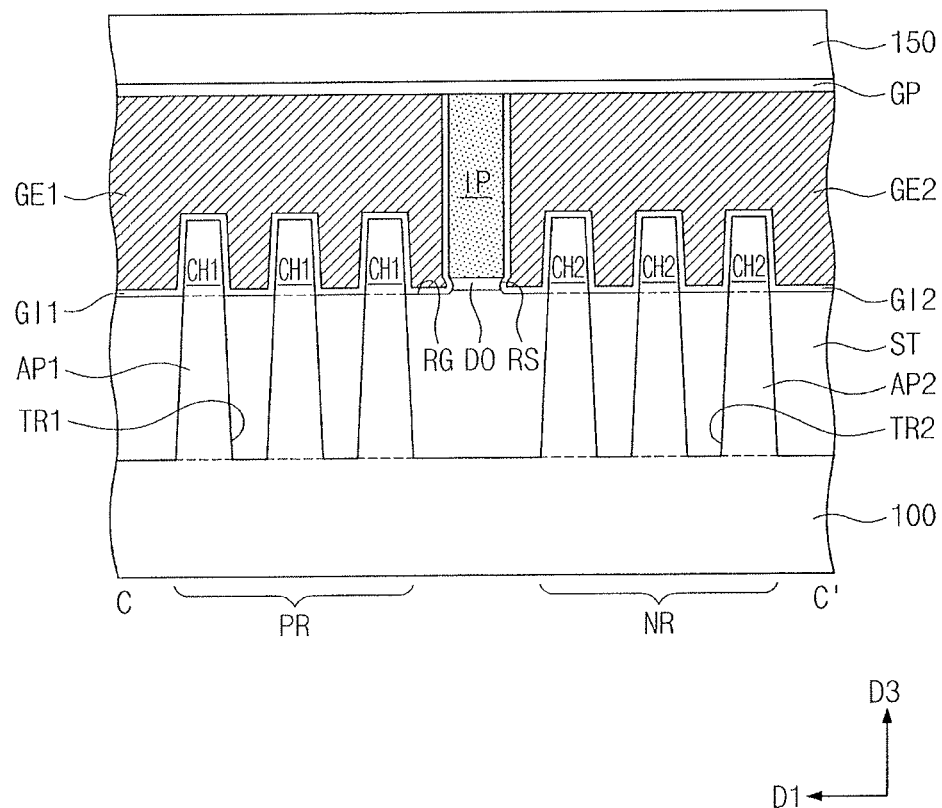
FIG. 22 illustrates a cross-sectional view taken along line C-C' of FIG. 1 of a semiconductor device according to exemplary embodiments.

FIG. 22 is a cross-sectional view taken along line C-C' of FIG. 1 for explaining a semiconductor device according to exemplary embodiments. In the embodiment that follows, a detailed description of technical features repetitive to those formerly discussed with reference to FIGS. 1, 2A to 2D, and 3 will be omitted and differences will be discussed in detail.

Referring to FIGS. 1, 2A, 2B, 2D, and 22, the second insulation pattern DO may include a recess region RS. The recess region RS may be formed between the first insulation pattern IP and the device isolation layer ST. The recess region RS may be recessed toward a center of the second insulation pattern DO. For example, the recess region RS may be recessed in the first direction D1. The recess region RS may be included in an upper portion of the device isolation layer ST below the second insulation pattern DO. The recess region RS in the upper portion of the device isolation layer ST may be aligned with the recess region RS included in the second insulation pattern DO. The recess region RS may be formed when the lower insulation layer DL is over-etched during the isotropic etch process discussed above with reference to FIGS. 18 and 19A to 19D.

Figure 23A:
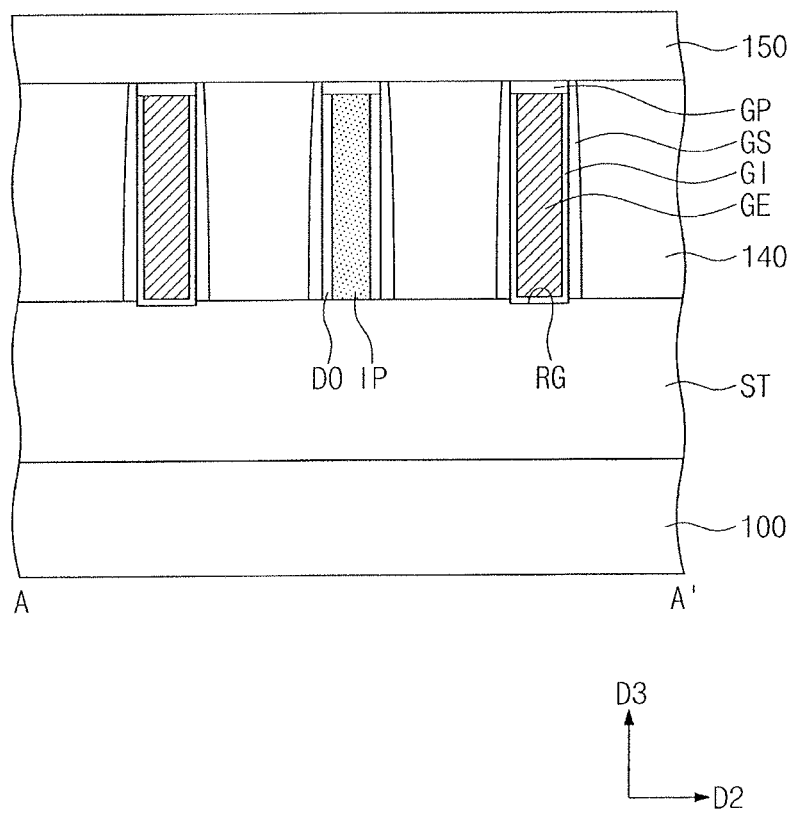
FIGS. 23A and 23B illustrate cross-sectional views along lines A-A' and B-B' of FIG. 1, respectively, of a semiconductor device according to exemplary embodiments.
Figure 23B:
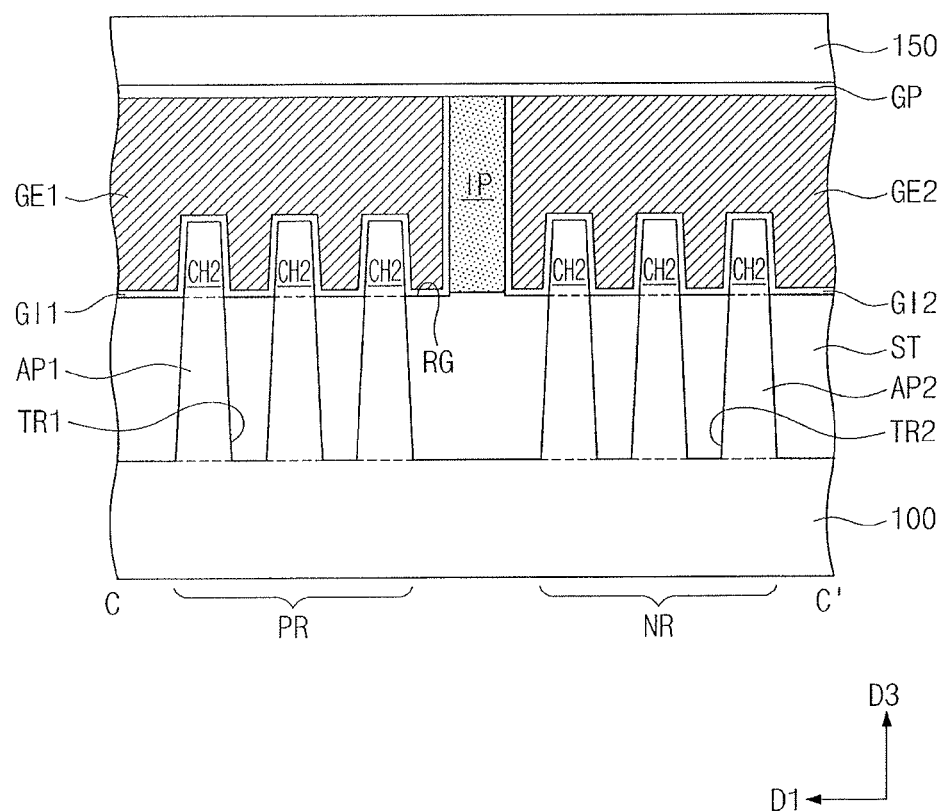
Figure 24:
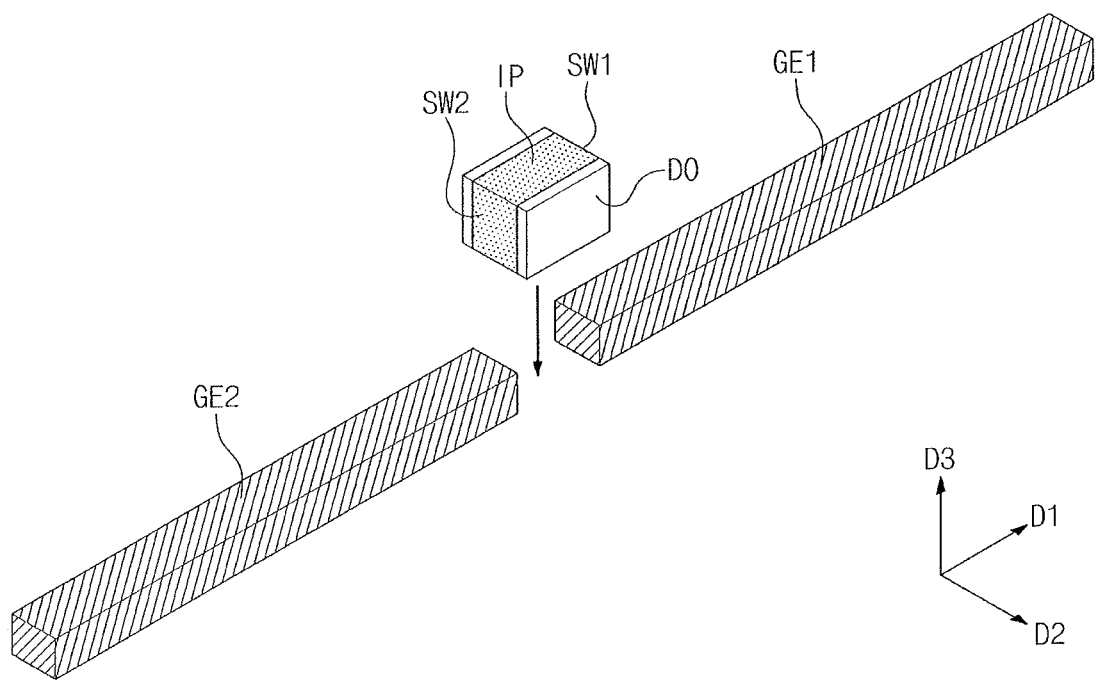
FIG. 24 illustrates a schematic perspective view of first and second gate electrodes and first and second insulation patterns according to exemplary embodiments.
Figure 25A:
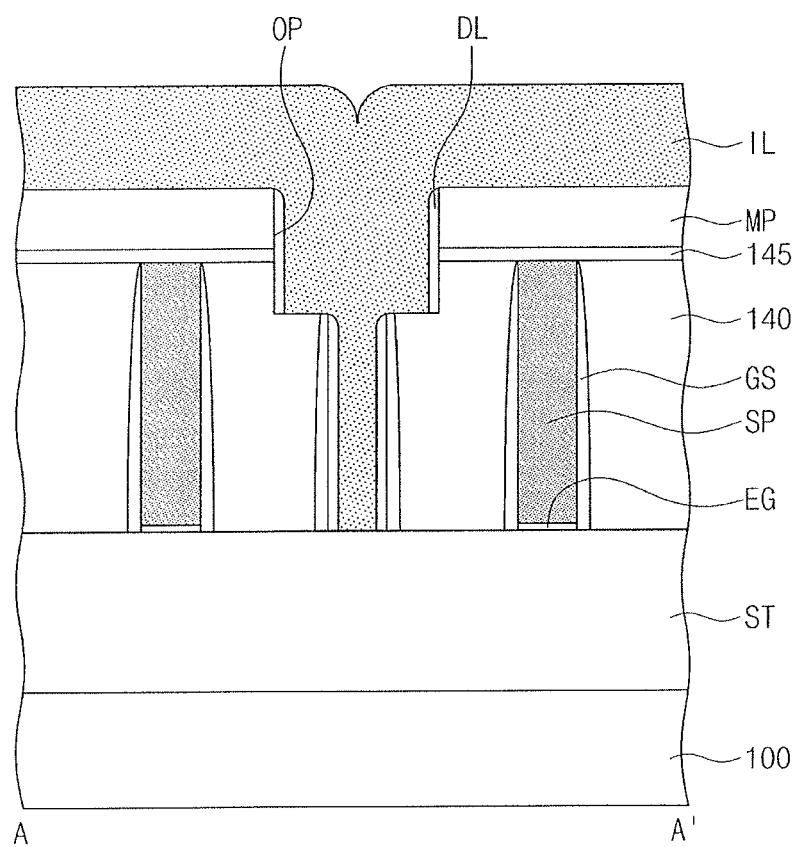
FIGS. 25A to 25D illustrate cross-sectional views along lines A-A', B-B', C-C', and D-D' of FIG. 1, respectively, of stages in a method of manufacturing a semiconductor device according to exemplary embodiments.
Figure 25B:
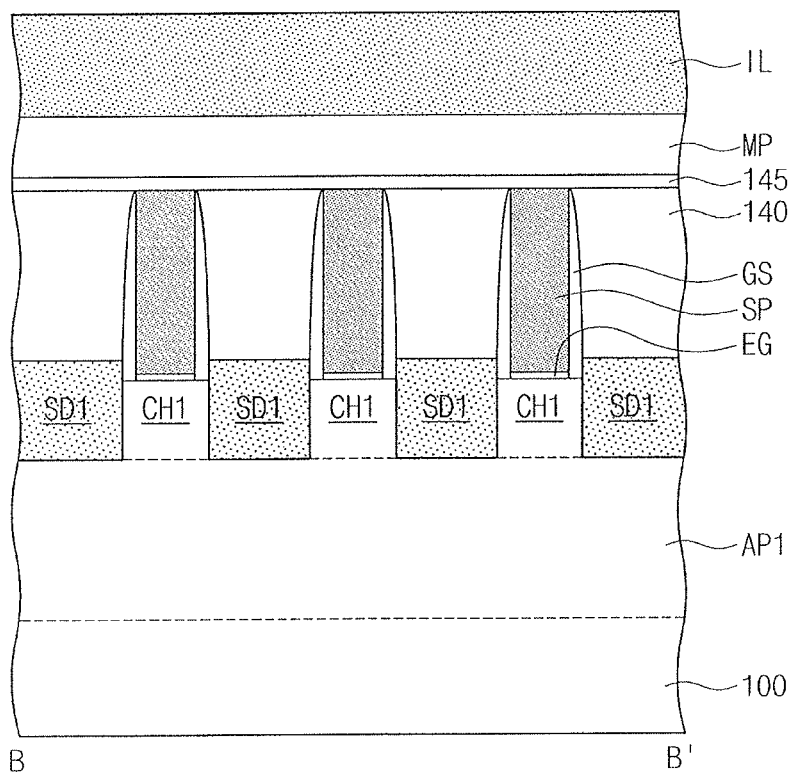
Figure 25C:
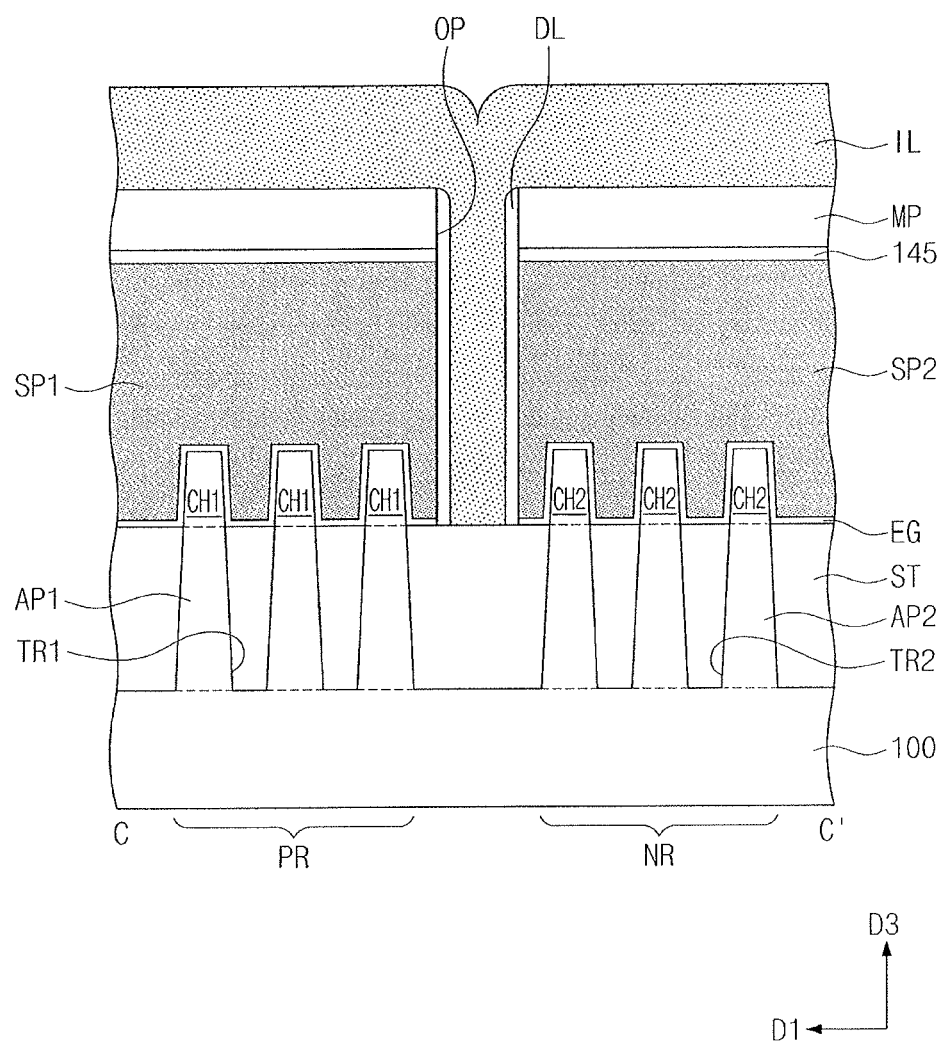
Figure 25D:
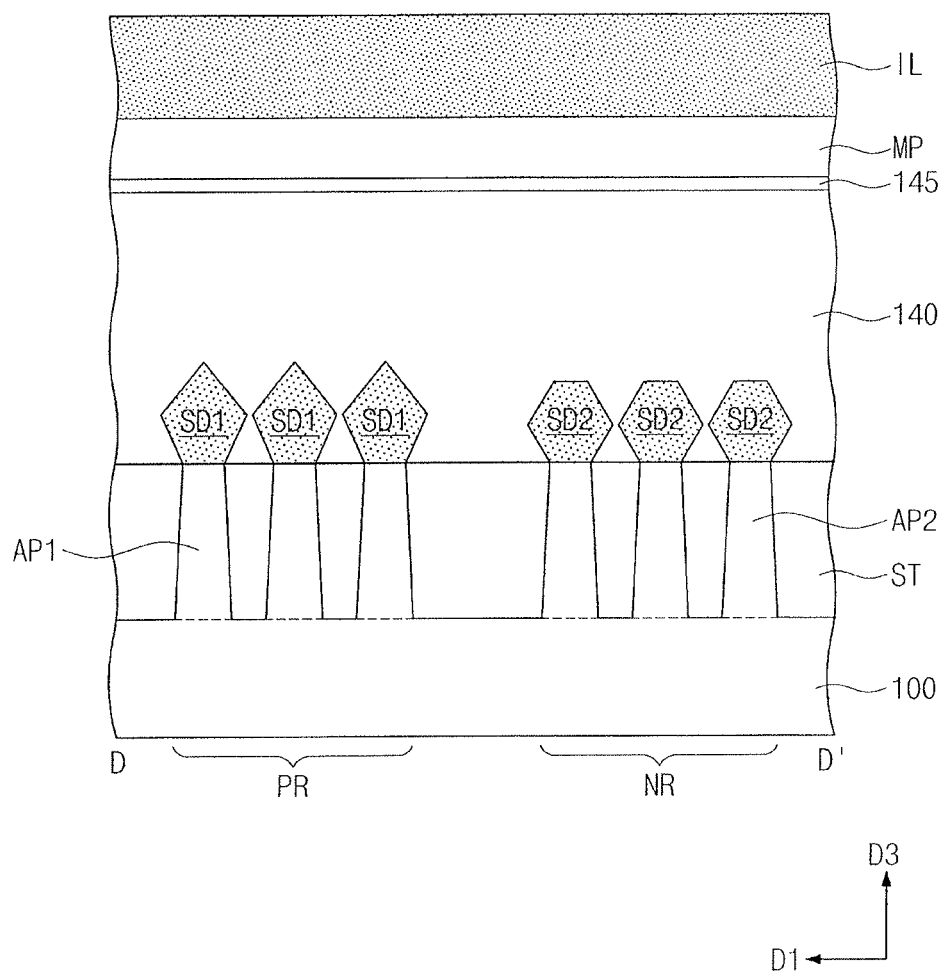

FIGS. 23A and 23B are cross-sectional views respectively taken along lines A-A' and B-B' of FIG. 1 for explaining a semiconductor device according to exemplary embodiments. FIG. 24 is a perspective view roughly illustrating first and second gate electrodes and first and second insulation patterns according to exemplary embodiments. In the embodiment that follows, a detailed description of technical features repetitive to those formerly discussed with reference to FIGS. 1, 2A to 2D, and 3 will be omitted and differences will be discussed in detail.

Referring to FIGS. 1, 2B, 2D, 23A, 23B, and 24, the second insulation pattern DO may not cover the bottom surface of the first insulation pattern IP. The first insulation pattern IP may be in direct contact with the device isolation layer ST. The second insulation pattern DO may be provided in a pair to cover opposite sidewalls of the first insulation pattern IP.

FIGS. 25A to 25D are cross-sectional views respectively taken along lines A-A', B-B', C-C', and D-D' of FIG. 1 for explaining a method of manufacturing a semiconductor device according to exemplary embodiments.

Referring to FIGS. 12 and 25A to 25D, the lower insulation layer DL may be formed on a resultant structure of FIGS. 10 and 11A to 11D. The lower insulation layer DL may experience an anisotropic etch process, and thus be reshaped into a spacer shape. Thereafter, the upper insulation layer IL may be formed. As the lower insulation layer DL has the spacer shape, the upper insulation layer IL may be in direct contact with the device isolation layer ST. Other processes except for the above-mentioned may be identical to those discussed formerly with reference to FIGS. 4 to 21D.

Figure 26:
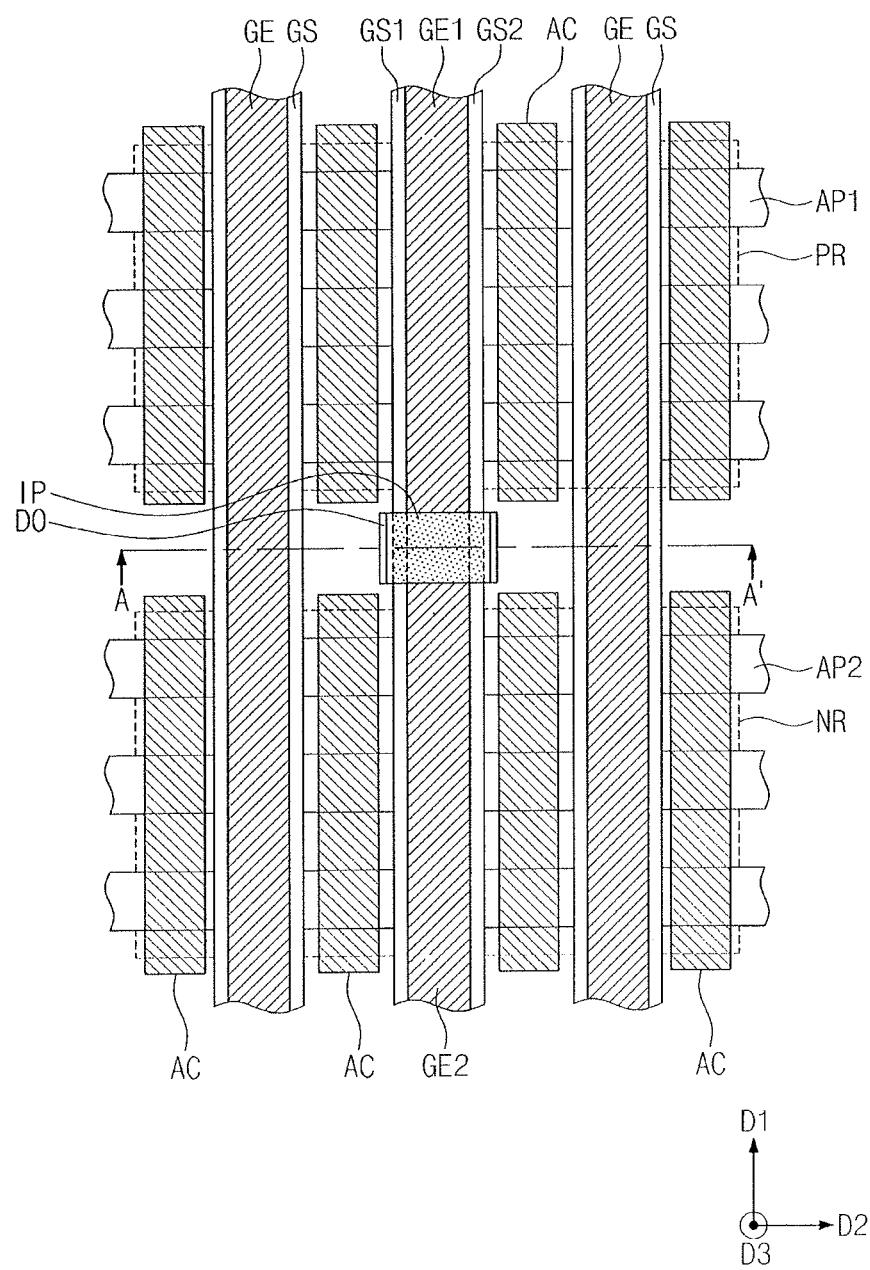
FIG. 26 illustrates a plan view of a semiconductor device according to exemplary embodiments.
Figure 27:
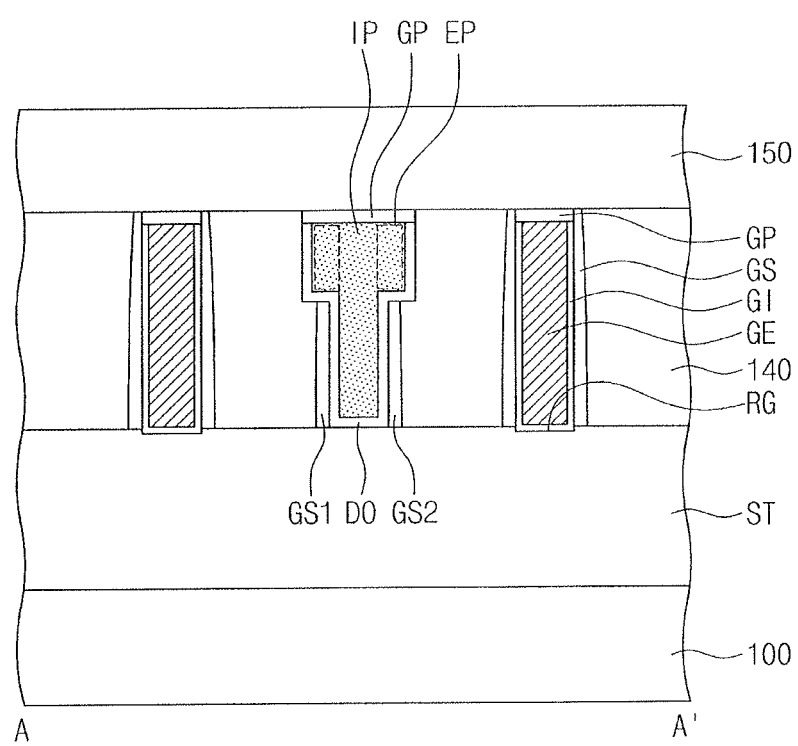
FIG. 27 illustrates a cross-sectional view taken along line A-A' of FIG. 26.

FIG. 26 is a plan view for explaining a semiconductor device according to exemplary embodiments. FIG. 27 is a cross-sectional view taken along line A-A' of FIG. 26. In the embodiment that follows, a detailed description of technical features repetitive to those formerly discussed with reference to FIGS. 1, 2A to 2D, and 3 will be omitted and differences will be discussed in detail.

Referring to FIGS. 26 and 27, the first insulation pattern IP may include thereon a pair of extensions EP. Each of the extensions EP may protrude from the first insulation pattern IP toward the gate electrode GE adjacent to the first insulation pattern IP. The first gate spacer GS1 may have a recessed portion adjacent to the first insulation pattern IP, and the second gate spacer GS2 may have a recessed portion adjacent to the first insulation pattern IP. The portions of the first and second gate spacers GS1 and GS2 may have top surfaces lower than those of other gate spacers GS.

The second insulation pattern DO may be interposed between the first insulation pattern IP and the first and second gate spacers GS1 and GS2. The second insulation pattern DO may be vertically interposed between the extensions EP and the first and second gate spacers GS1 and GS2. That is, the second insulation pattern DO may be interposed between bottom surfaces of the extensions EP and top surfaces of the first and second gate spacers GS1 and GS2. The extensions EP may vertically overlap the first and second gate spacers GS1 and GS2.

According to exemplary embodiments, the first and second gate spacers GS1 and GS2 may be provided thereon with the extensions EP exhibiting a relatively strong etch resistance, such that it may be possible to reduce process risk of electrical short occurred between the contacts AC that are self-alignedly formed.

Figure 10:
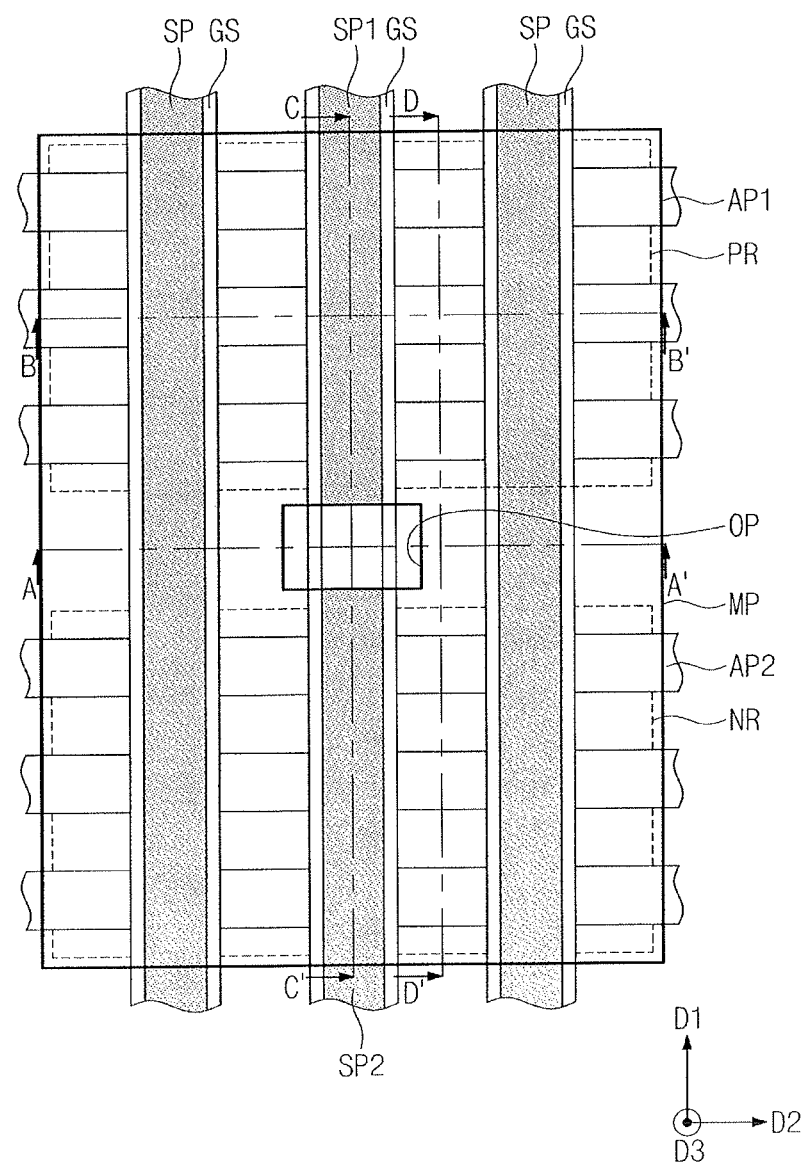
Figure 11A:
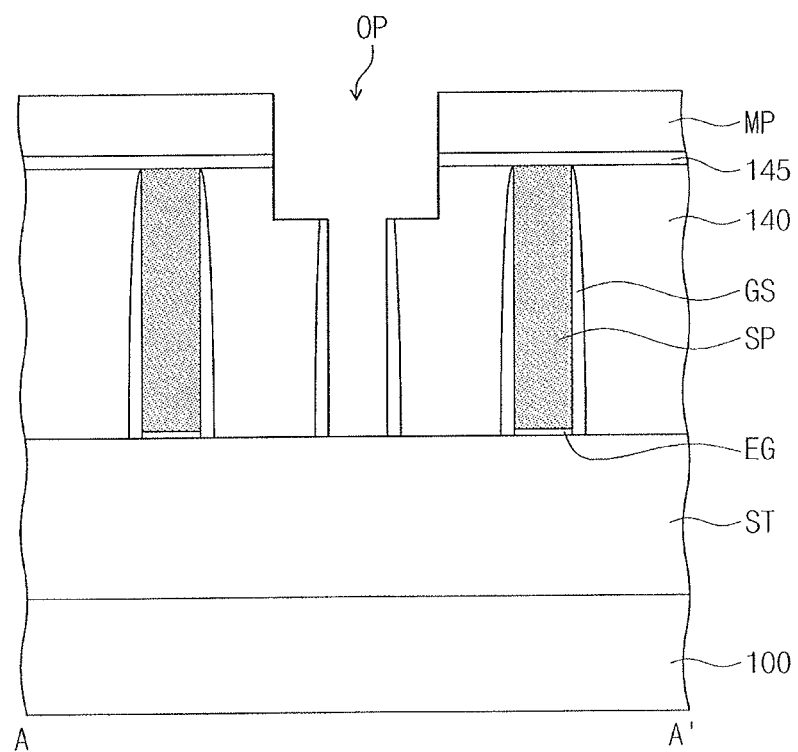
Figure 11A:
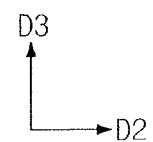
Figure 11B:
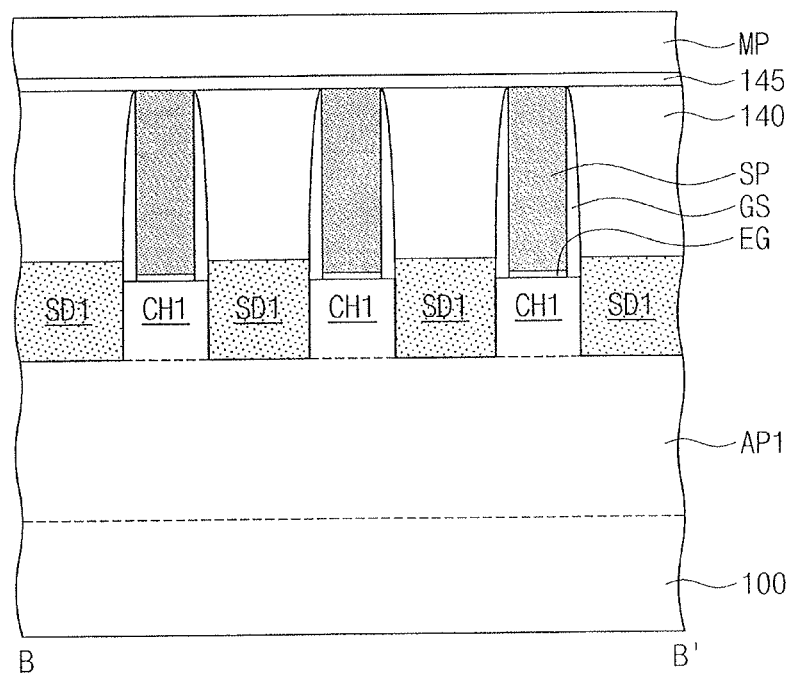
Figure 11C:
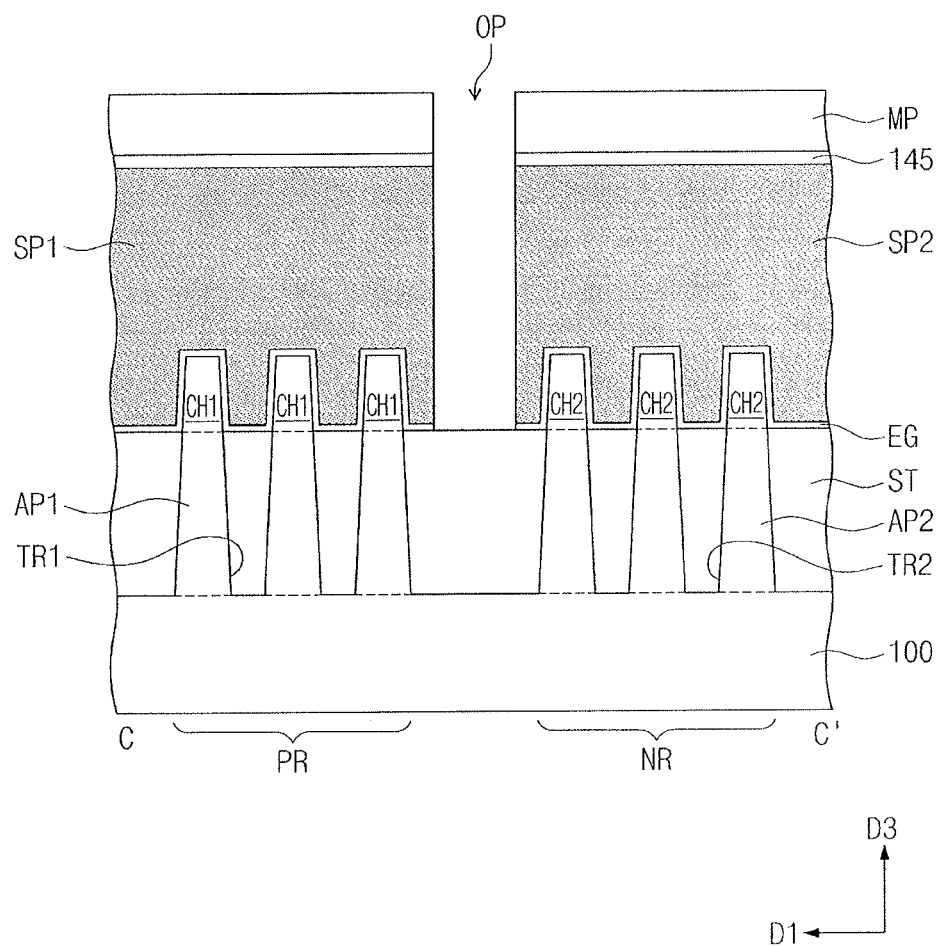
Figure 11D:
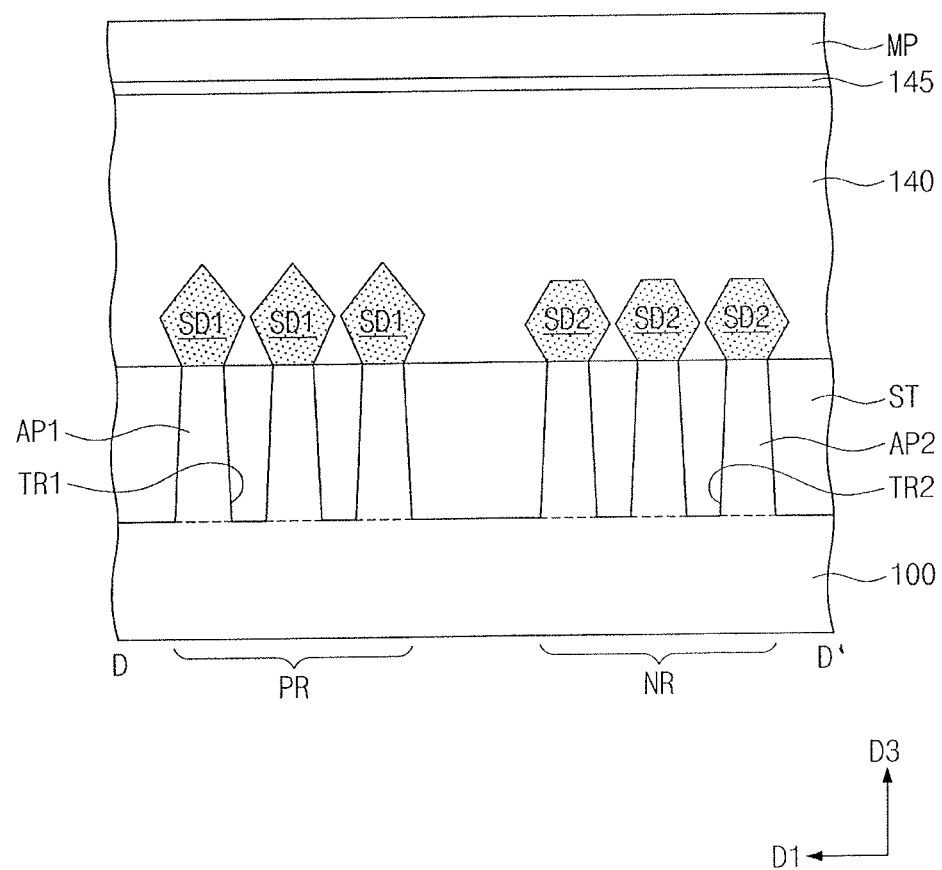
Figure 12:
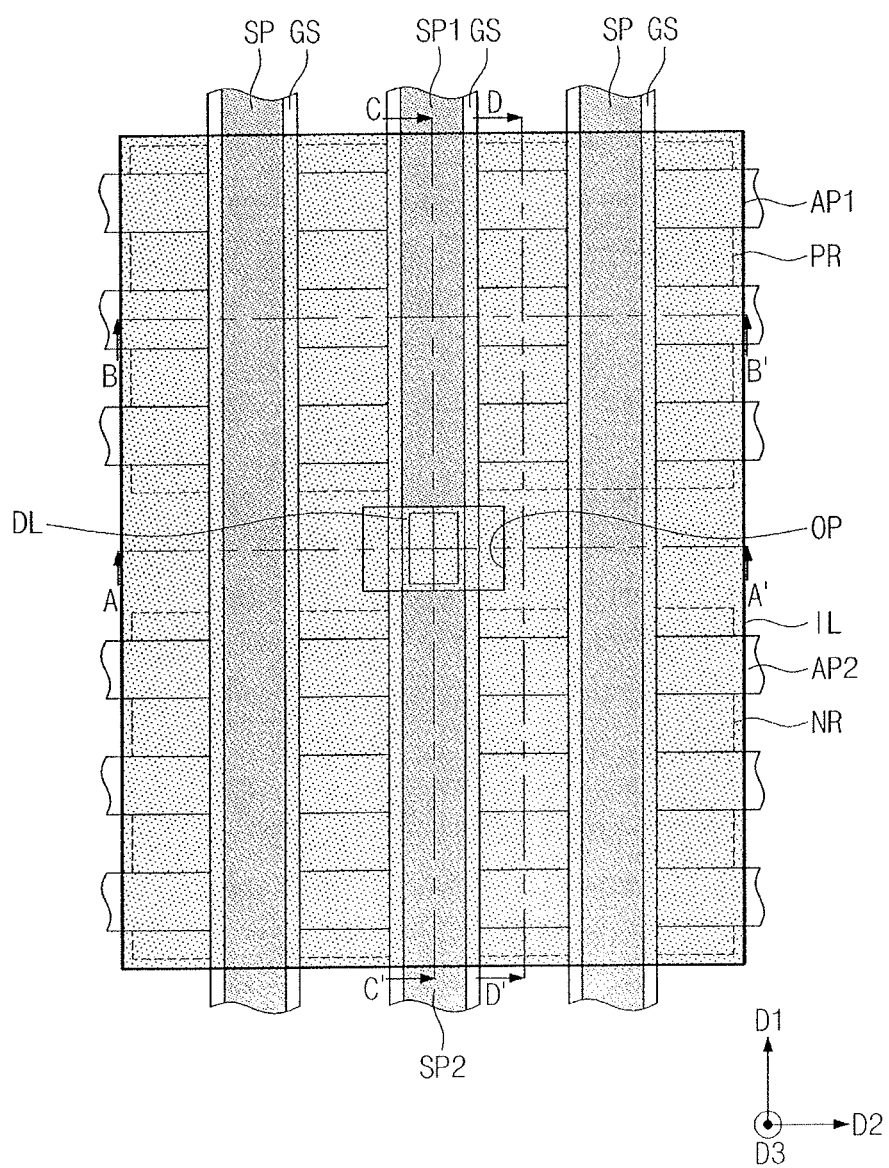
Figure 13A:
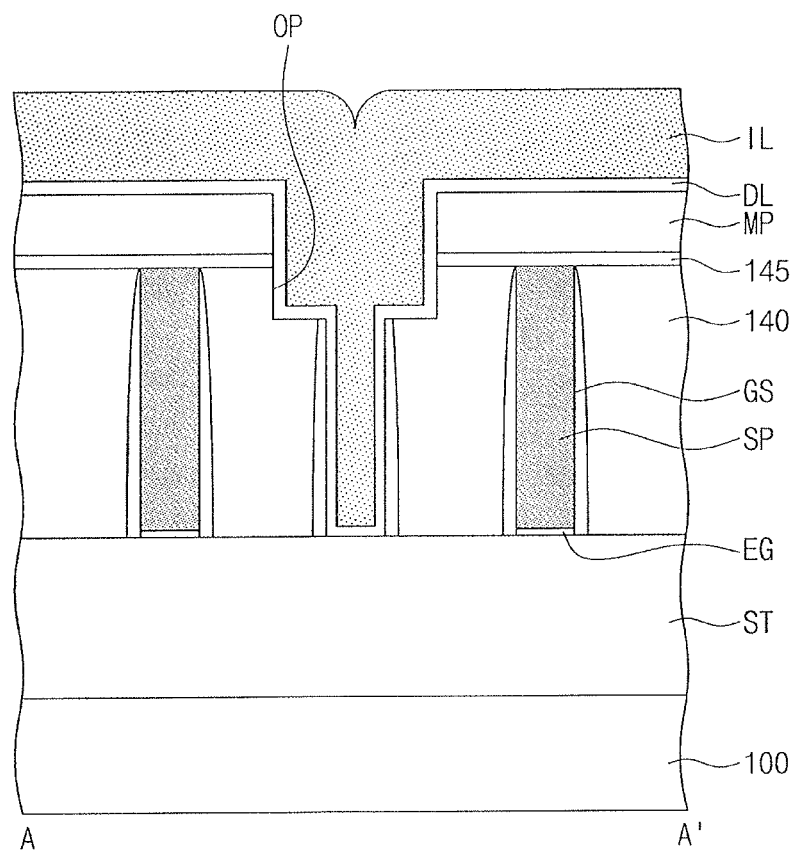
Figure 13B:
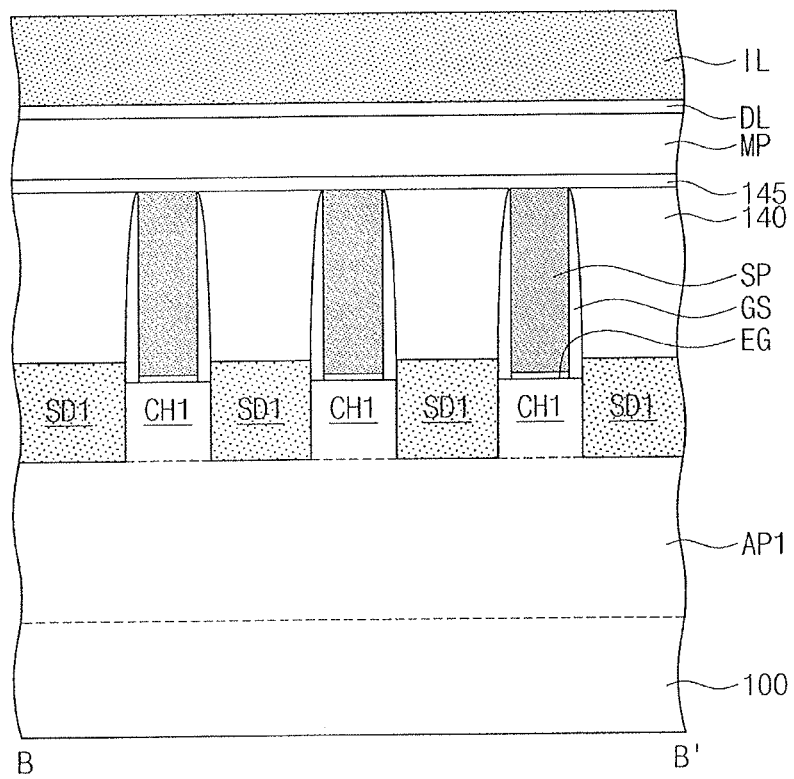
Figure 13C:
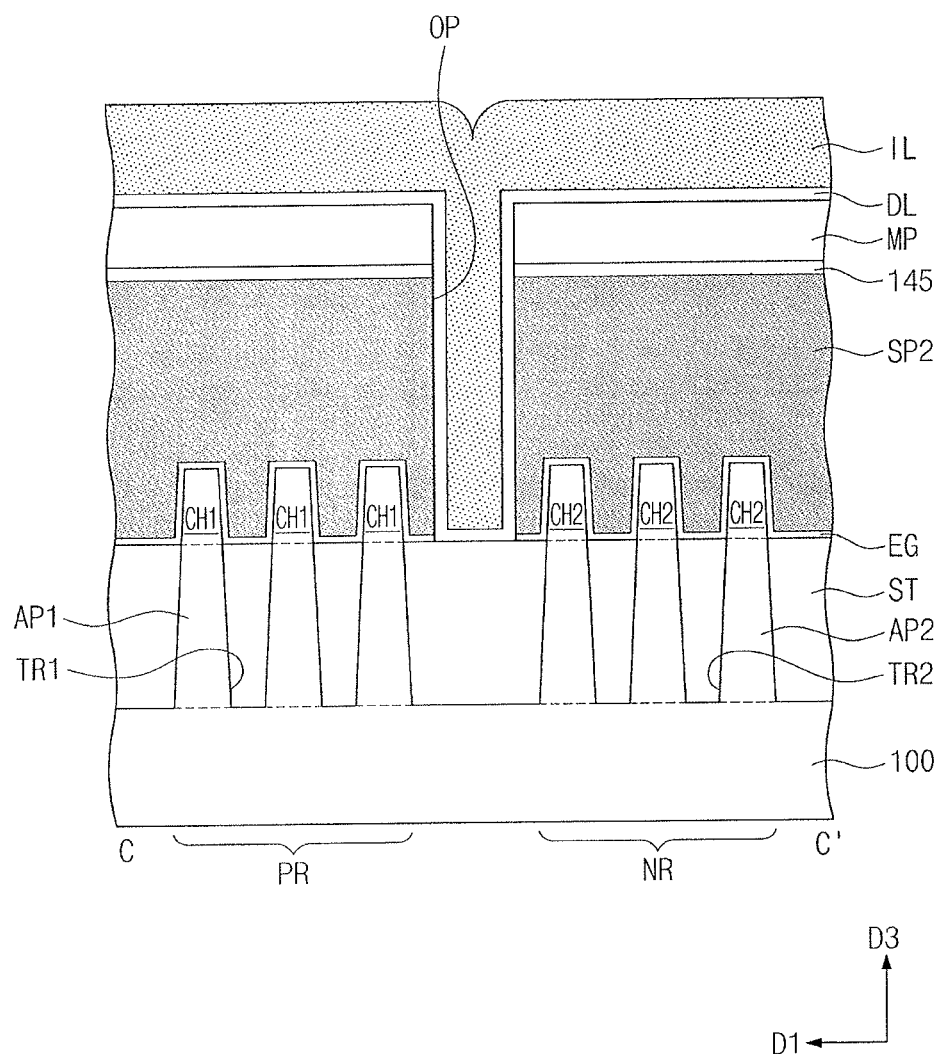
Figure 13D:
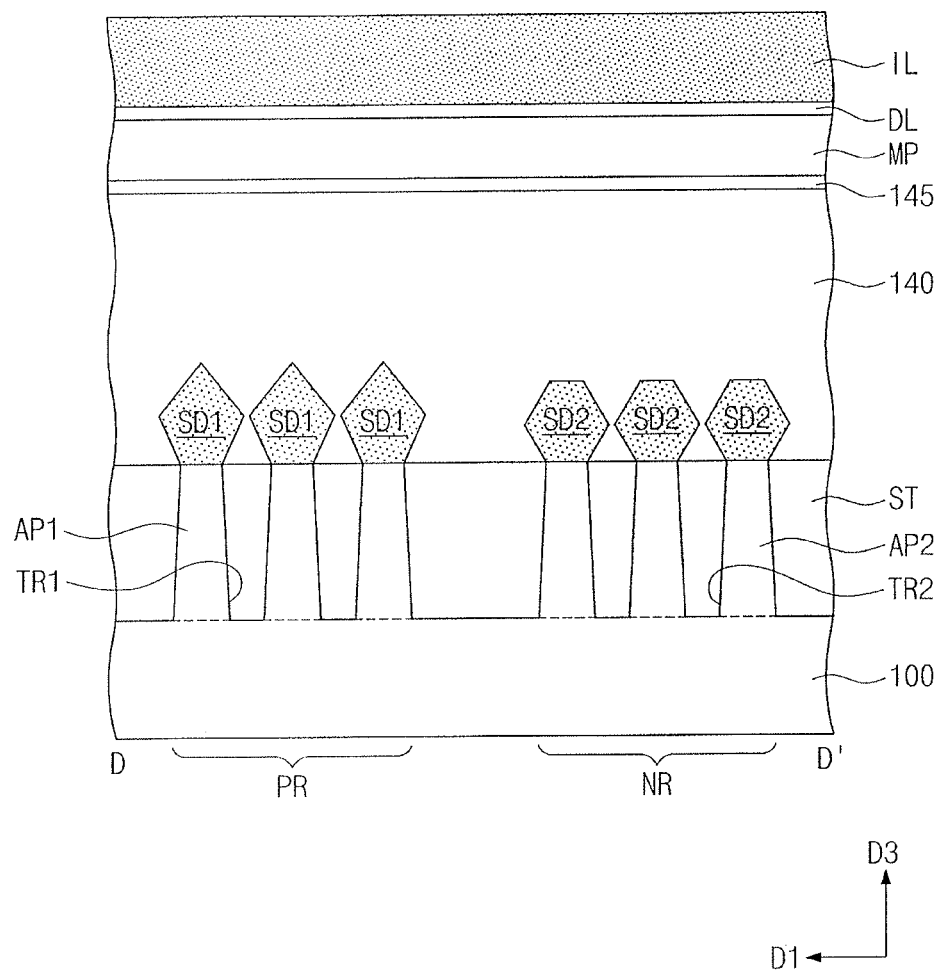
Figure 14:
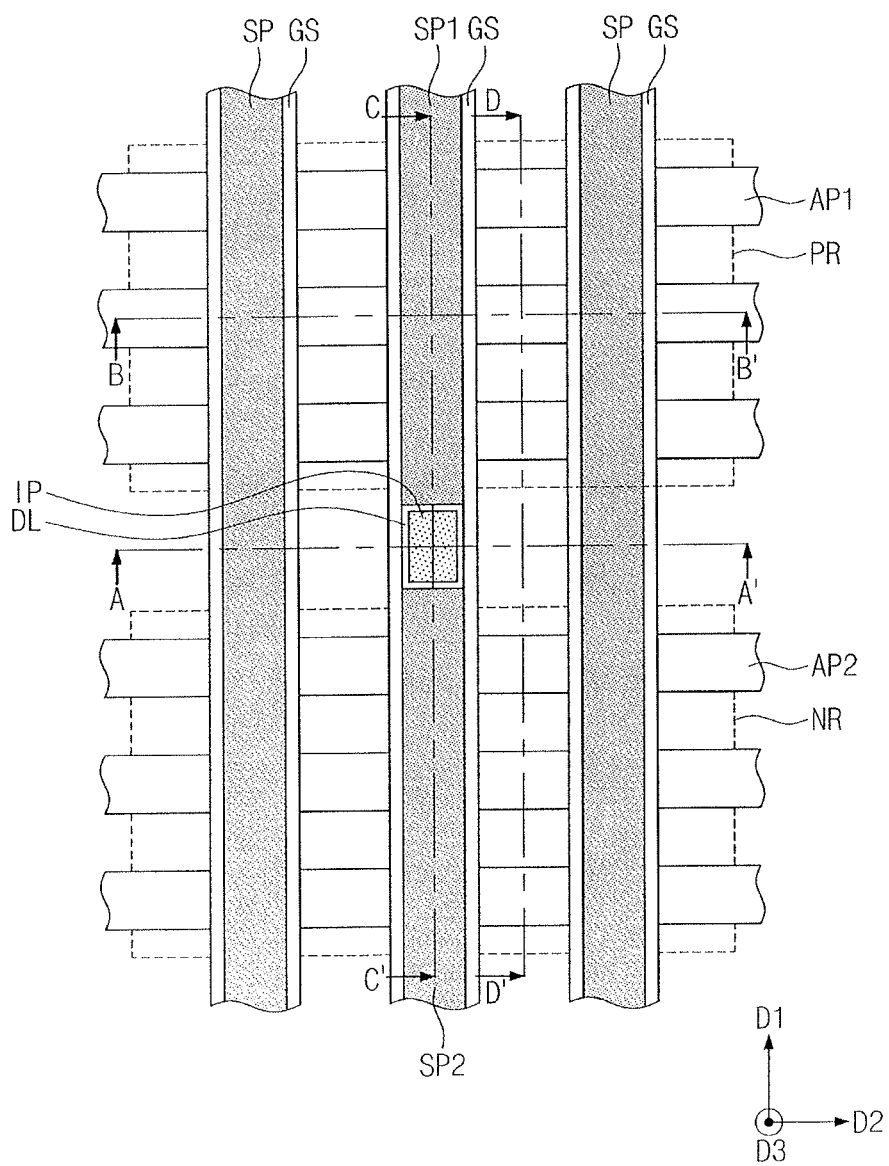
Figure 15A:
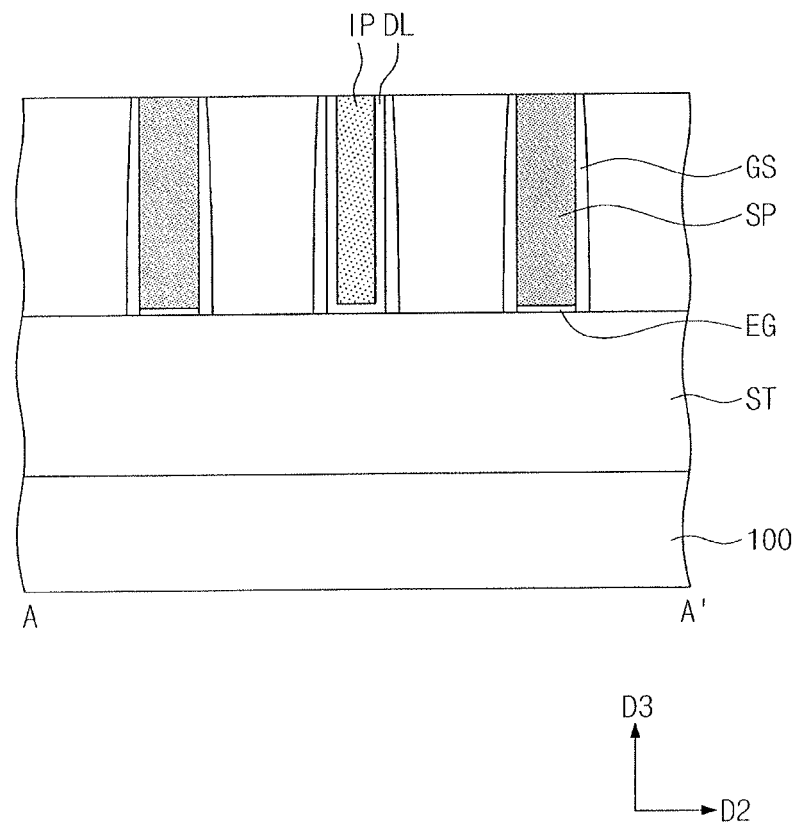
Figure 15B:
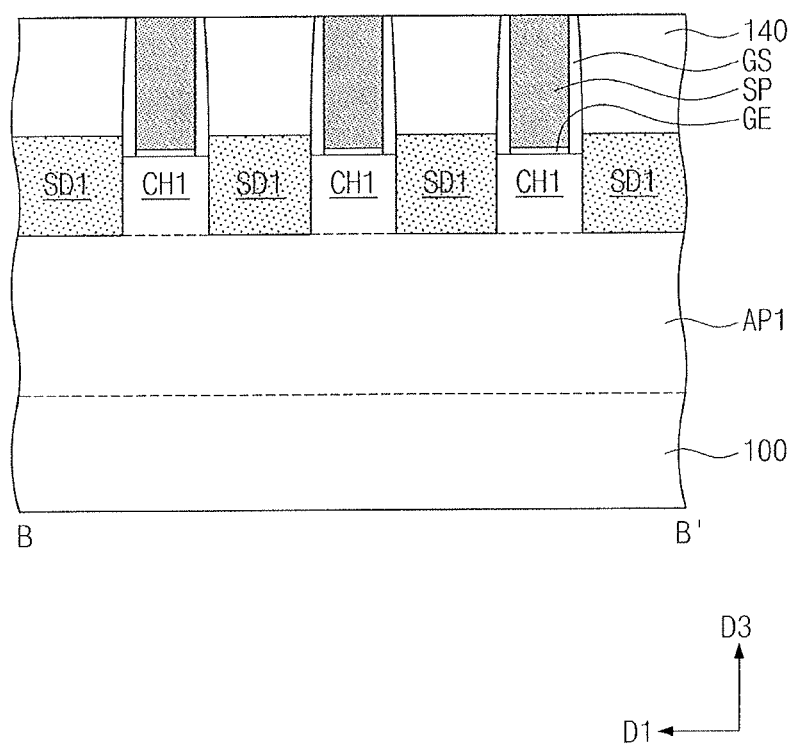
Figure 15C:
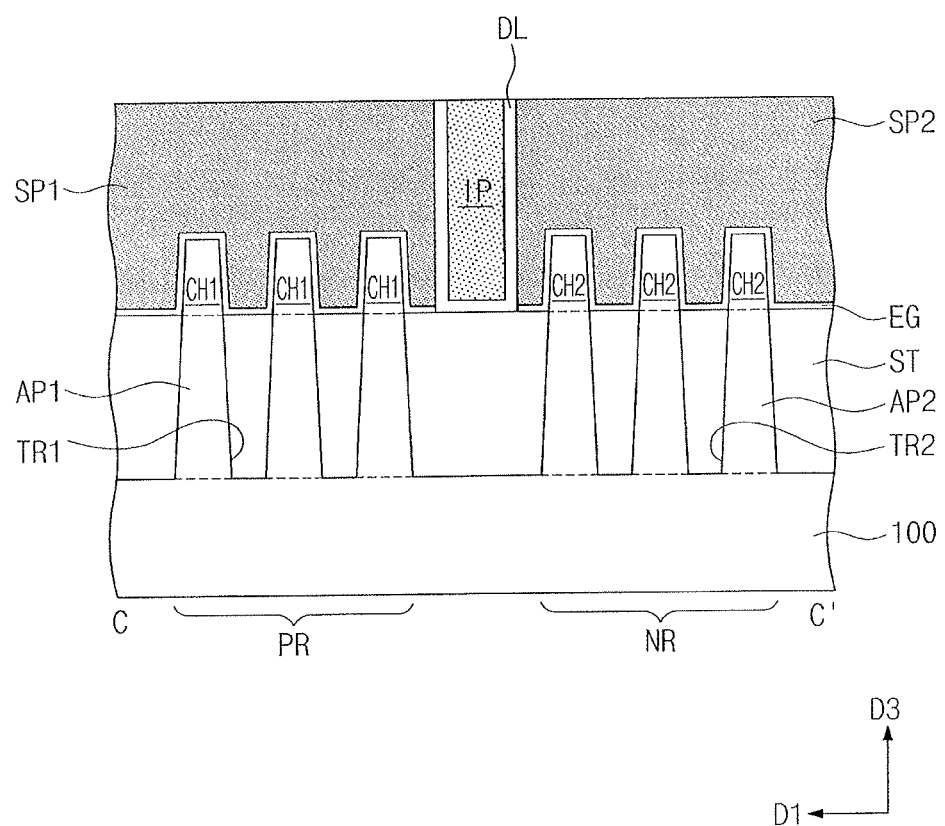
Figure 15D:
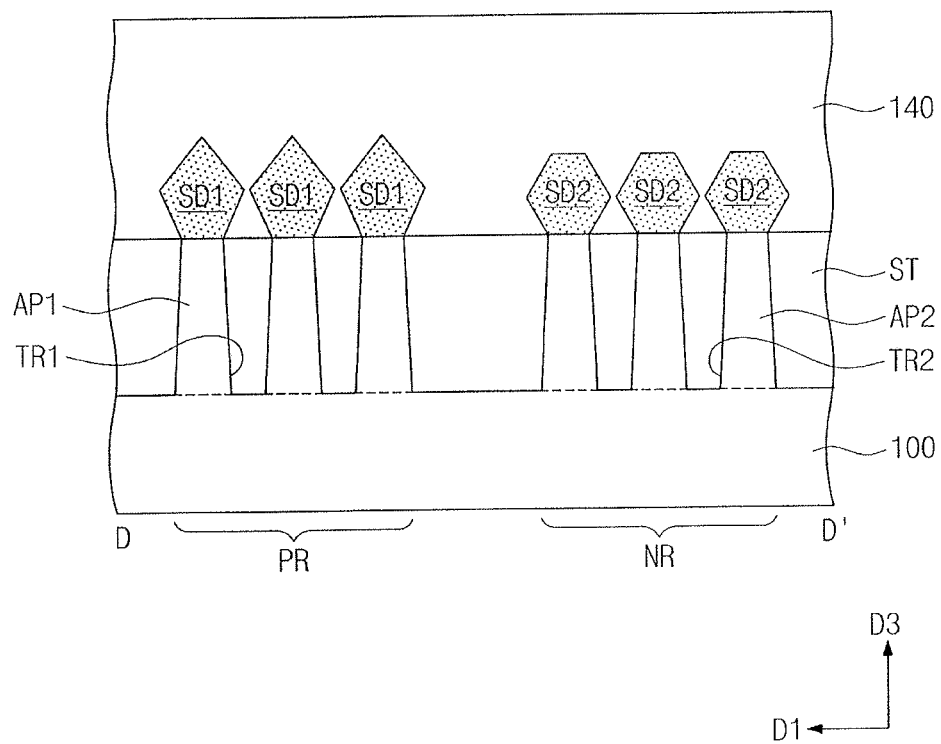
Figure 16:
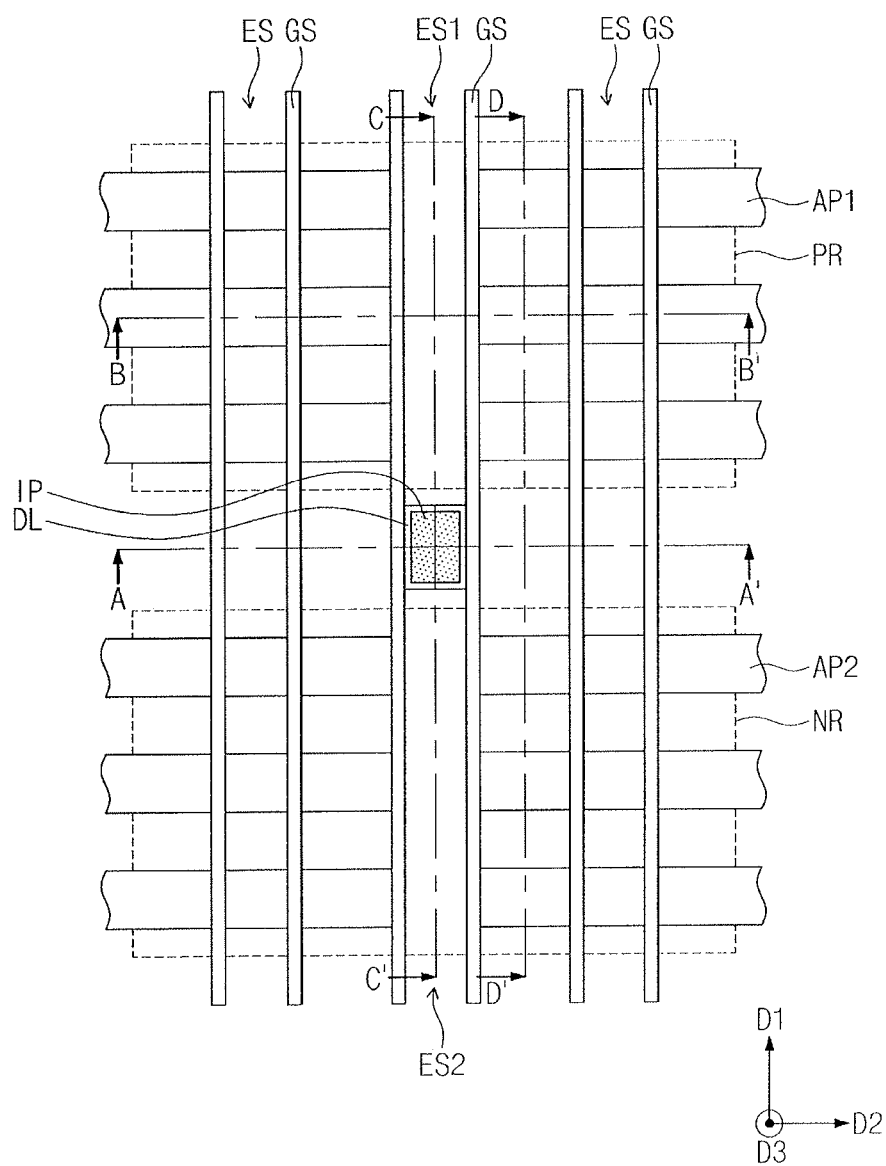
Figure 28:
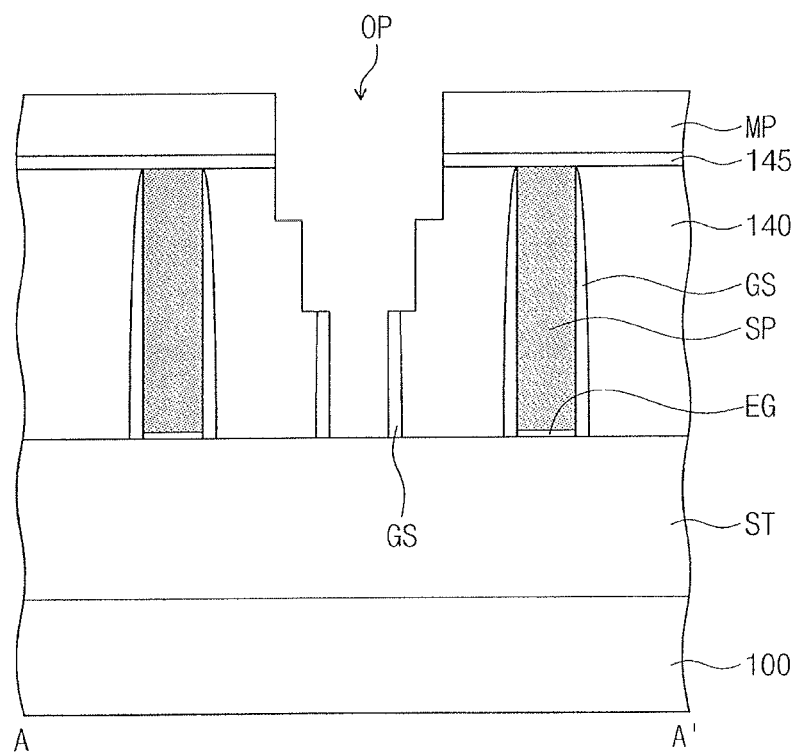
FIGS. 28 and 29 illustrate cross-sectional views along line A-A' of FIGS. 10 and 12, respectively, of stages in a method of manufacturing a semiconductor device according to exemplary embodiments.
Figure 29:
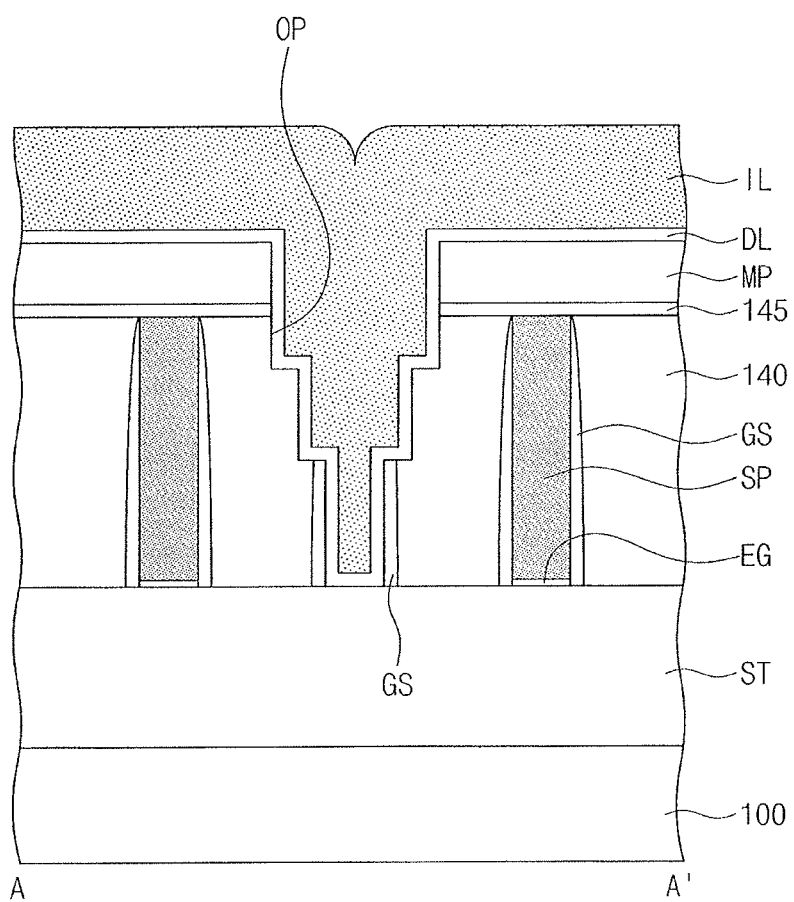

FIGS. 28 and 29 are cross-sectional views taken along line A-A' of FIGS. 10 and 12, respectively, for explaining a method of manufacturing a semiconductor device according to exemplary embodiments.

Referring to FIGS. 10 and 28, on a resultant structure of FIGS. 10 and 11A to 11D, the gate spacers GS exposed through the opening OP may be recessed. The recessed gate spacers GS may have top surfaces much lower than those of other gate spacers GS.

Referring to FIGS. 12 and 29, the lower insulation layer DL and the upper insulation layer IL may be sequentially formed to fill the opening OP. A portion of the upper insulation layer IL may be positioned above the recessed gate spacers GS. The portion of the upper insulation layer IL positioned above the gate spacers GS may be formed into the extensions EP discussed with reference to FIGS. 26 and 27. Other processes except for the above-mentioned may be identical to those discussed formerly with reference to FIGS. 4 to 21D.

By way of summation and review, embodiments provide a semiconductor device including a field effect transistor that has enhanced electrical characteristics. Embodiments also provide a method of manufacturing such a semiconductor device. That is, a semiconductor device according to embodiments includes gate electrodes of PMOSFET and NMOSFET regions that are separated from each other by first and second insulation patterns. A relatively large distance may be secured between the first insulation pattern and its neighboring active pattern, and therefore, a gate electrode may be formed in an area space between the first insulation pattern and its neighboring active pattern, thereby enhancing electrical characteristics of a transistor. As the first insulation pattern has a strong etch resistance, an electrical short may be prevented between adjacent contacts when the contacts are self-alignedly formed.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a semiconductor device, the method comprising:
  forming a first active pattern and a second active pattern on a substrate;
  forming a sacrificial pattern across the first and second active patterns;
  forming a gate spacer on a sidewall of the sacrificial pattern;
  removing a first portion of the sacrificial pattern to form an opening;
  sequentially forming a lower insulation layer and an upper insulation layer that fill the opening;
  removing second and third portions of the sacrificial pattern to form a first empty space and a second empty space; and
  removing a side portion of the lower insulation layer exposed through the first and second empty spaces to form a first insulation pattern,
  wherein the first portion of the sacrificial pattern is between the first and second active patterns,
  wherein the second portion of the sacrificial pattern crosses the first active pattern, and
  wherein the third portion of the sacrificial pattern crosses the second active pattern.

2. The method as claimed in claim 1, further comprising forming first and second gate electrodes that fill the first and second empty spaces, respectively.

3. The method as claimed in claim 1, further comprising forming a device isolation layer to define the first and second active patterns at an upper portion of the substrate, and
  wherein the first portion of the sacrificial pattern vertically overlaps the device isolation layer.

4. The method as claimed in claim 1, further comprising planarizing the upper insulation layer until exposing a top surface of the sacrificial pattern to form a second insulation pattern in the opening.

5. The method as claimed in claim 1, wherein a bottom portion of the lower insulation layer is interposed between the upper insulation layer and the substrate.

6. The method as claimed in claim 1, wherein, before forming the upper insulation layer, further comprising anisotropically etching the lower insulation layer, such that the lower insulation layer has a spacer shape.

7. The method as claimed in claim 1, further comprising removing an upper portion of the gate spacer exposed through the opening.

8. A method of manufacturing a semiconductor device, the method comprising:
  forming a first active pattern and a second active pattern on a substrate;

forming a first gate electrode and a second gate electrode respectively across the first active pattern and the second active pattern;

forming a first insulation pattern between and separating the first and second gate electrodes;

forming a gate spacer on a sidewall of the first gate electrode, on a sidewall of the second gate electrode, and on a sidewall of the first insulation pattern; and forming a second insulation pattern between the gate spacer and the sidewall of the first insulation pattern, wherein the first gate electrode, the first insulation pattern, and the second gate electrode are arranged along a first direction, and wherein the gate spacer extends in the first direction.

9. The method as claimed in claim 1, wherein forming the first and second insulation patterns includes:

sequentially forming a lower insulation layer and the first insulating pattern between the first and second gate electrodes; and removing a side portion of the lower insulation layer to form the second insulation pattern.

10. The method as claimed in claim 9, wherein a bottom portion of the lower insulation layer is interposed between the first insulating pattern and the substrate.

11. The method as claimed in claim 8, further comprising forming a device isolation layer to define the first and second active patterns at an upper portion of the substrate, and wherein the first and second insulation patterns vertically overlaps the device isolation layer.

12. The method as claimed in claim 1, further comprising removing an upper portion of the gate spacer.

13. The method as claimed in claim 1, further comprising forming a gate dielectric pattern between the first active pattern and the first gate electrode and between the first insulation pattern and the first gate electrode.

14. The method as claimed in claim 1, further comprising forming a gate capping pattern covering top surfaces of the first and second gate electrodes and a top surface of the first insulation pattern.

15. A method of manufacturing a semiconductor device, the method comprising:

forming a first active pattern and a second active pattern on a substrate;

forming a first gate electrode and a second gate electrode respectively across the first active pattern and the second active pattern;

forming a first insulation pattern between the first and second gate electrodes, the first gate electrode, the first insulation pattern, and the second gate electrode being arranged along a first direction; and forming a second insulation pattern on the first insulation pattern, wherein forming the second insulation pattern includes:

forming a lower insulation layer covering a bottom surface and sidewalls of the first insulation pattern; and removing a side portion of the lower insulation layer to expose opposite sidewalls of the first insulation pattern facing the first and second gate electrodes.

16. The method as claimed in claim 15, wherein a bottom portion of the lower insulation layer is interposed between the first insulation pattern and the substrate.

17. The method as claimed in claim 15, further comprising forming a device isolation layer to define the first and second active patterns at an upper portion of the substrate, and wherein the first and second insulation patterns vertically overlap the device isolation layer.

18. The method as claimed in claim 15, further comprising forming a gate dielectric pattern between the first active pattern and the first gate electrode and between the first insulation pattern and the first gate electrode.

19. The method as claimed in claim 15, further comprising forming a gate capping pattern covering top surfaces of the first and second gate electrodes and a top surface of the first insulation pattern.

20. The method as claimed in claim 15, further comprising forming a gate spacer along the first direction on sidewalls of the first gate electrode, of the first insulation pattern, and of the second gate electrode, wherein the second insulation pattern is between the gate spacer and the first insulation pattern along a second direction.

* * * * *